United States Patent
Somayajula et al.

(10) Patent No.: US 12,248,016 B2
(45) Date of Patent: Mar. 11, 2025

(54) ESTIMATION OF LIFE OF SWITCHING DEVICES

(71) Applicant: EATON INTELLIGENT POWER LIMITED, Dublin (IE)

(72) Inventors: Deepak Balaji Somayajula, Maharashtra (IN); Swati Narula, New Delhi (IN); Sravanthi Srikantam, Andhra Pradesh (IN); Satish Mohanty, Pune (IN); Chaitanya Pradeep Bhalwankar, Pune (IN); Stuart John Moody, Portchester (GB); Daniel Peck, Southampton (GB); Ranjith Kumar Sreenilayam Raveendran, Maharashtra (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 155 days.

(21) Appl. No.: 18/079,707

(22) Filed: Dec. 12, 2022

(65) Prior Publication Data
US 2023/0194593 A1 Jun. 22, 2023

(51) Int. Cl.
G01R 31/26 (2020.01)
G01R 31/28 (2006.01)
G05B 23/02 (2006.01)

(52) U.S. Cl.
CPC ..... *G01R 31/2642* (2013.01); *G01R 31/2874* (2013.01); *G05B 23/0283* (2013.01)

(58) Field of Classification Search
CPC ............ G01R 31/2608; G01R 31/2621; G01R 31/2642; G01R 31/2874
See application file for complete search history.

(56) References Cited

U.S. PATENT DOCUMENTS 9,086,448 B2 7/2015 Huang et al.
9,632,115 B2 4/2017 Wu et al.
(Continued)

FOREIGN PATENT DOCUMENTS

| CN | 110514978 A | 11/2019 |
|---|---|---|
| JP | 2003009541 | * 1/2003 |
| KR | 20200102170 A | 8/2020 |

OTHER PUBLICATIONS

European Patent Office, Extended European Search Report for Application No. 22214047.7 mailed May 9, 2023, 15 pages.
(Continued)

*Primary Examiner* — Thang X Le
(74) *Attorney, Agent, or Firm* — Merchant & Gould P.C.

(57) ABSTRACT

A health signature of each switching device in a control system is estimated using system parameters such as a DC-link voltage, three-phase voltages, three-phase currents, and temperature. The switching devices can be implemented as transistors, and a health signature for each transistor may be an on-state resistance or an on-state voltage of the transistors. For example, the on-state resistance for a metal-oxide-semiconductor field-effect transistor (MOSFET) functions as a health signature. Alternatively, the on-state voltage is used as a health signature for an insulated-gate bipolar transistor (IGBT). Additionally, a junction temperature is estimated for each transistor. Using the estimated health signatures and the junction temperatures, the remaining useful life of each transistor is estimated.

21 Claims, 9 Drawing Sheets

(56) References Cited

U.S. PATENT DOCUMENTS

| | | | | |
|---|---|---|---|---|
| 2017/0003337 | A1* | 1/2017 | Bito | H03K 19/018507 |
| 2019/0033362 | A1 | 1/2019 | Aeloiza et al. | |
| 2019/0250205 | A1* | 8/2019 | Sarwar | G08B 21/182 |
| 2020/0235731 | A1* | 7/2020 | Wang | H03K 17/18 |
| 2020/0408830 | A1 | 12/2020 | Degrenne | |
| 2021/0203309 | A1* | 7/2021 | Wang | H03K 3/011 |
| 2022/0349934 | A1* | 11/2022 | Li | G01R 31/2648 |

OTHER PUBLICATIONS

Celaya, Jose R., et al., "Prognostics Approach for Power MOSFET under Thermal-Stress Aging", Reliability and Maintainability Symposium (RAMS), 2012 Proceedings—Annual, IEEE, Jan. 23, 2012 (Jan. 23, 2012), pp. 1-6.

Dusmez, Serkan, et al., "Remaining Useful Lifetime Estimation for Thermally Stressed Power MOSFETs Based on on-State Resistance Variation", IEEE Transactions on Industry Applications, US, vol. 52, No. 3, May 1, 2016, pp. 2554-2563.

Alyakhni Ahmad et al: "Joint Estimation of MOSFET Degradation in a DC-DC Converter Using Extended Kalman Filter", 2019 4th Conference on Control and Fault Tolerant Systems (SYSTOL), IEEE, Sep. 18, 2019 (Sep. 18, 2019), pp. 319-324.

Eleffendi, Mohd. Amir, et al., "Evaluation of On-state Voltage VCE(ON) and Threshold Voltage Vth for Real-time Health Monitoring of IGBT Power Modules", 2015 17th European Conference on Power Electronics and Applications (EPE'15 ECCE—Europe), Jointly Owned by EPE Association and IEEE PELS, Sep. 8, 2015, pp. 1-10.

Eleffendi, Mohd. Amir et al., "In-Service Diagnostics for Wire-Bond Lift-off and Solder Fatigue of Power Semiconductor Packages", IEEE Transactions on Power Electronics, Institute of Electrical and Electronics Engineers, USA, vol. 32, No. 9, Sep. 1, 2017, pp. 7187-7198.

S. Dusmez, H. Duran and B. Akin, "Remaining Useful Lifetime Estimation for Thermally Stressed Power MOSFETs Based on on-State Resistance Variation," in IEEE Transactions on Industry Applications, vol. 52, No. 3, pp. 2554-2563, May-Jun. 2016, doi: 10.1109/TIA.2016.2518127.

* cited by examiner

US 12,248,016 B2

ESTIMATION OF LIFE OF SWITCHING DEVICES

CROSS-REFERENCE TO RELATED APPLICATION

This application claims the benefit of Indian Provisional Patent Application No. 202111058967, filed on Dec. 17, 2021, the disclosure of which is incorporated herein by reference in its entirety.

Technical Field

The present disclosure relates generally to switching devices in an alternate fuel transfer manifold and methods for estimating the remaining useful life of the switching devices.

BACKGROUND

Silicon switching devices, such as metal-oxide-semiconductor field-effect transistors (MOSFETs) and Insulated Gate Bipolar Transistors (IGBTs), are components that are used in a variety of electronic subsystems. Example electronic subsystems include, but are not limited to, direct current—alternating current (DC-AC) inverters, DC-DC converters, variable frequency drives (VFDs,) AC-DC rectifiers. In these electronic subsystems, the switching devices can fail due to unforeseen transient conditions such as short-circuits, over-voltages, and the like. The switching devices also fail as a result of the natural degradation of the switching devices over time.

Protection circuits are generally designed to prevent circuit failures due to the transient conditions, and condition monitoring systems are designed to observe and quantify the natural degradation of the switching devices. Operating point information such as device voltages, device currents, and device temperatures are the device parameters that influence the stress experienced by the switching devices. As the stress on the switching devices increases over time, the switching devices begin to wear out, which in turn reduces the remaining useful life (RUL) of the switching devices.

In a non-limiting example, an Alternate Fuel Transfer Manifold (AFTM) is an aerospace ground refueling subsystem in which switching devices are an important part of the subsystem. The uninterrupted operation of the switching devices is crucial for the overall uninterrupted operation of the AFTM. Therefore, the switching devices have been identified as key components in the AFTM subsystem whose health has to be monitored accurately to prevent unforeseen failures due to natural degradation and wear-out, which leads to downtime. It is desirable to be able to replace the switching devices during a planned maintenance to reduce the downtime and increase the operational availability of the AFTM subsystem.

SUMMARY OF THE INVENTION

In a first aspect, a method of estimating a remaining useful life (RUL) of a switching device is disclosed. The method comprises: estimating a health signature of the switching device while the switching device is in use; calculating a health state estimation matrix by modeling the degradation of a health signature over a time interval using Kalman filtering; using the health state estimation matrix, determining a health state of the switching device at a first time; forecasting, based on the health state and the health state estimation matrix, a time at which the switching device reaches a failure criterion; and causing a notification to be provided to an output device, the notification including the time at which the switching device is forecasted to reach the failure criterion.

In a second aspect, a control system for a three-phase motor is disclosed. The control system comprises a switching system including a plurality of switching devices operable to output three-phase voltage signals; a processing device; and memory storing instructions that when executed by the processing device, cause the processing device to estimate a remaining useful life (RUL) of each of the plurality of switching device, wherein to estimate the RUL of each of the plurality of switching devices includes, for each switching device of the plurality of switching devices: estimate a health signature of the switching device while the switching device is in use; calculate a health state estimation matrix by modeling the degradation of a health signature over a time interval using Kalman filtering; using the health state estimation matrix, determine a health state of the switching device at a first time; forecast, based on the health state and the health state estimation matrix, a time at which the switching device reaches a failure criterion; and causing a notification to be provided to an output device, the notification including the time at which the switching device is forecasted to reach the failure criterion.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Figure 1:
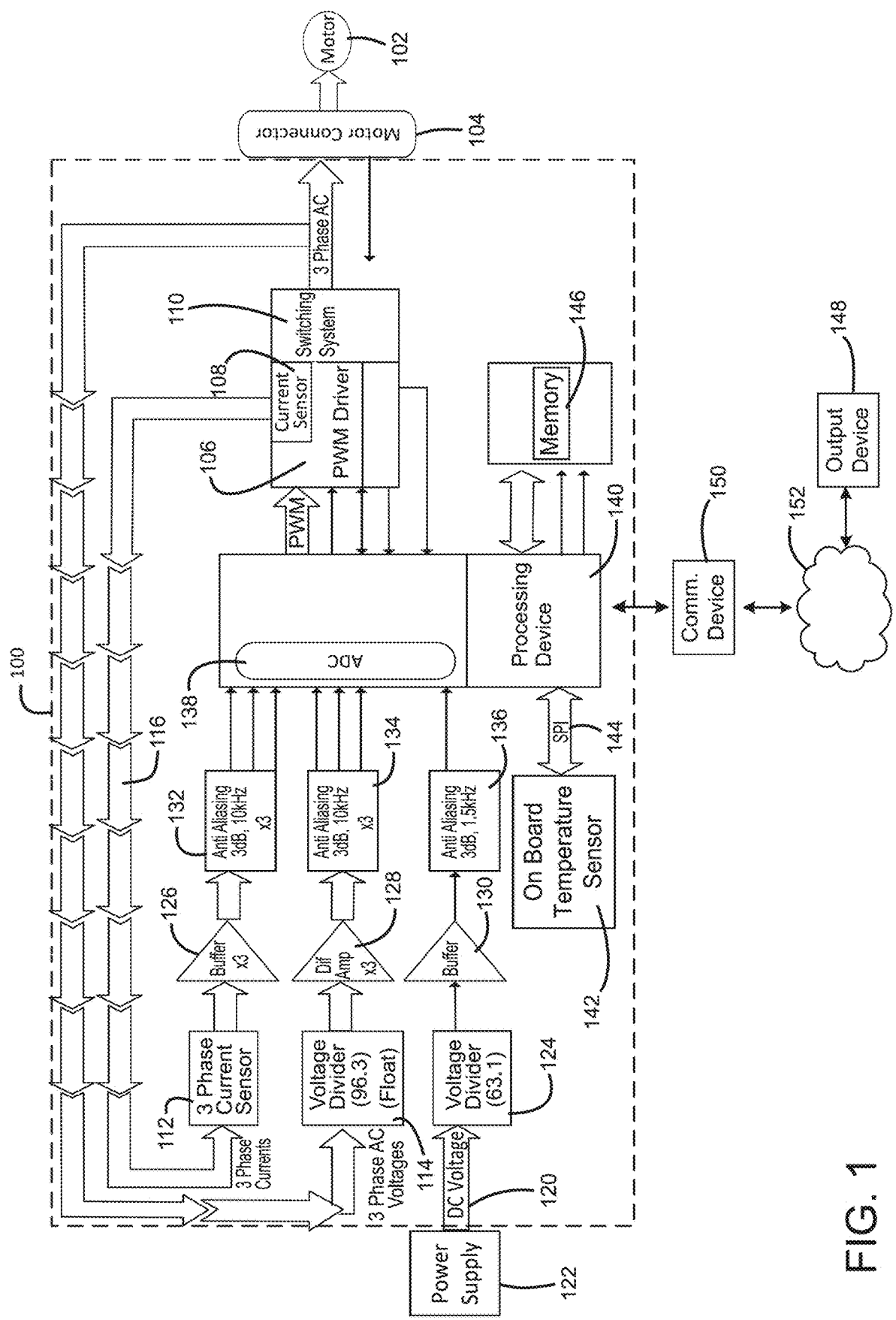
FIG. 1 is a block diagram of an example control system in accordance with the principles of the present disclosure.

Silicon metal-oxide semiconductor field-effect transistors (MOSFETS) and insulated-gate bipolar transistor (IGBT)

devices are critical components in electronic subsystems like DC-AC inverters, DC-DC converts, AC-DC rectifiers, etc. However, the MOSFETs and IGBT devices in electronic subsystems could fail due to unforeseen transients like short-circuits, over-voltages, etc., or due to normal wearing and degradation of the devices. While protection circuits are generally designed to protect or prevent circuit failures due to transients, there is still a need to predict when a device failure or end of life of a device may occur due to normal wear and degradation of the device.

Condition monitoring systems are designed to observe and quantify the natural degradation and wear-out of MOSFET and IGBT devices using operating point information such as device voltages, device currents, device temperatures, etc. The device parameters of a device influence the stress experienced by the device and the stress experienced by a device influences the degradation, and ultimately, when the end of life or device failure may occur. Predicting the end of life of a device or when a device failure will occur allows for the user to replace the device before the occurrence of device failure.

In one example, the end of life may be estimated by calculating the mean time before failure (MTBF) value. For example, a MTBF calculation for devices may be performed during a design phase of an electronic subsystem to estimate the failure rate of a device based on maximum stress experienced by the device. In the disclosed examples, the end of life or failure of a device may be predicted by estimating the health and remaining useful life (RUL) of a device periodically and, using a Kalman filter, predicting when device failure or end of life of the device may occur based on the historical trends in degradation of the device over time. The health and RUL of a device can be monitored continuously or at select times while the electronic subsystem with the device is in use in the field using online (e.g., cloud or network) systems or local systems.

The prediction of the time at which end of life of the device may occur maybe continuously adjusted based on the degradation rate experienced by the device since the previous prediction. A maintenance alarm may be triggered to indicate to a user that the end of life of a device is predicted to occur within a threshold timeframe. The maintenance alarm gives the user advance notice on an upcoming device failure and allows the user enough time to order a spare device and replace the device before the device failure due to end of life of the device occurs.

In examples disclosed herein, a switching system includes multiple switching devices. Each switching device is implemented as a transistor and a health signature of each transistor is estimated using system parameters such as a DC-link voltage, three-phase voltages, three-phase currents, and temperature. For example, the on-state resistance $R_{DSON}$ for a MOSFET functions as a health signature. Alternatively, the on-state voltage $V_{CEON}$ is used as a health signature for an IGBT. Additionally, a junction temperature is estimated for each transistor. Using the estimated health signature and the junction temperature, the RULs of the transistors are estimated.

FIG. 1 is a block diagram of an example control system in accordance with the principles of the present disclosure. The example control system 100 is operably connected to a motor 102 via a motor connector 104. The control system is used to control the motor 102. In the illustrated example, the motor 102 is a three-phase motor.

A pulse width modulator (PWM) driver circuit 106 is operably connected to current sensors 108, a switching system 110, a three-phase current sensor 112, and a three-phase voltage sensor 114. The PWM driver circuit 106 provides three-phase current signals to the current sensors 108. In one example, the three-phase current signals sensed by the current sensors 108 are used in the estimation of $R_{DSON}$ for the switching devices in the switching system 110, which in turn are used in the estimation of the RULs of the switching devices. The current sensors 108 output the three-phase current signals 116, which are received by the three-phase current sensor 112.

Although the current sensors 108 and the three-phase current sensor 112 are both shown and described, in some implementations, there may be either the current sensors 108 or the three-phase current sensor 112.

The PWM driver 106 also outputs control signals to the switching system 110, which responsively outputs three-phase AC voltage signals 118 that are received by the three-phase voltage sensor 114. The three-phase voltage sensor 114 is used to sense or determine the voltage levels of the three-phase voltage signals 118. In the illustrated example, the switching system 110 includes six switching devices, but other examples are not limited to this configuration. The switching system 110 can include any suitable number of switching devices, such as four switching devices. The three-phase voltage sensor 114 may be a capacitive type or a resistive type voltage sensor. In the illustrated example, the three-phase voltage sensor 114 is implemented as a voltage divider circuit. However, other examples can configure the three-voltage sensor differently, such as with a bridge circuit.

A DC voltage signal 120 is received from a power supply 122 and input into a voltage sensor 124. In one example, the voltage sensor 124 is a voltage divider circuit that is used to determine the voltage levels of the DC voltage signal 120. In one example, the power supply 122 is disposed on a circuit board in an aircraft system.

The three-phase current sensor 112 is operably connected to a first buffer circuit 126. The three-phase voltage sensor 114 is operably connected to a differential amplifier circuit 128. The voltage sensor 124 is operably connected to a second buffer circuit 130. The three-phase current sensor 112, the three-phase voltage sensor 114, and the voltage sensor 124 output signals that are received by the first and the second buffer circuits 126, 130 and the differential amplifier circuit 128.

The first and the second buffer circuits 126, 130 and the differential amplifier circuit 128 each output signals that are input into respective anti-aliasing filter circuits 132, 134, 136. In the illustrated example, the first buffer circuit 126 represents three buffer circuits (one for each phase), the differential amplifier circuit 128 represents three differential amplifier circuits (one for each phase), and the anti-aliasing filter circuit 132 and the anti-aliasing filter circuit 134 each represent three anti-aliasing filter circuits (one for each phase).

An analog-to-digital converter (ADC) circuit 138 samples the signals output by the anti-aliasing filter circuits 132, 134, 136 and provides the signals to a processing device 140. The signals sampled by the ADC circuit 138 (the "sampled signals") represent the current levels of the three-phase current signals 116 sensed by the three-phase current sensor 112, the voltage levels of the three-phase voltage signals 118 sensed by the three-phase voltage sensor 114, and the voltage level of the DC voltage signal 120 sensed by the voltage sensor 124. A temperature sensor 142 is operable to sense the temperature and provide a temperature signal 144 that represents the temperature level to the processing device 140.

The processing device 140 uses the sampled signals and the temperature signal 144 to estimate the remaining useful life (RUL) of the switching devices 110. In one example, the current signals sensed by both the current sensors 108 and the three-phase current sensor 112 are used in the estimations of at least the health signatures of the switching devices (e.g., $R_{DSON}$ and $V_{CEON}$), although other examples are not limited to this implementation. The processing device 140 can be any suitable processing device, such as a processor, a CPU, a digital signal processor, a field programmable gate array, or combinations thereof.

One or more memory devices (collectively memory 146) is operably connected to the processing device 140. In one example, the memory 146 stores data, such as the sensed signals, the temperature signals (or the values represented by the sensed signals and the temperature signals), one or more threshold RULs, and/or the equations and/or the results calculated with the equations discussed herein. The memory 146 stores computer-executable instructions that when executed by the processing device 140 cause the operations disclosed herein to be performed. The memory 146 may be any suitable read-only memory and/or random-access memory. The processing device 140 is configured to compare each RUL against one or more threshold RULs to determine if a respective switching device is near or at the end of the RUL. In one example, the processing device 140 is configured to compare the RUL against one threshold RUL that represents a minimum RUL (e.g., the end of the RUL). In another example, the processing device 140 is configured to compare the RUL to at least two threshold RULs. If the RUL is less than one RUL, the switching device is suitable for continued use (e.g., the processing device 140 is configured to determine the RUL is within a first range of RULs that indicate the switching device is not near the end of the useful life). If the RUL is equal to or greater than the first threshold RUL but less than the second RUL, the processing device is configured to determine the switching device is near the end of the RUL.). If the RUL is equal to or greater than the second threshold RUL, the processing device 140 is configured to determine the switching device is at the end of the RUL (or end of RUL is imminent).

The processing device 140 is configured to cause one or more notifications to be provided to one or more output devices (collectively referred to as output device 148). A notification provides information on one or more switching devices. For example, a notification can include an identifier of a switching device and the RUL of that switching device. In another example, the notification may include the identifier, the RUL of the switching device, and the threshold RUL(s).

The output device 148 can be any suitable output device. For example, the output device 148 may be a display device and the processing device 140 causes the notification to be displayed on the display device. In another example, the output device can be a remote computing device that is operable to receive the notification, where the notification is an electronic message, an audio message, a visual message, a text message, and a telephone call.

In some implementations, the processing device 140 transmits the notification(s) to the output device 148 using one or more communication devices (comm. Device 150), such as Wi-Fi, cellular, or near-field communication devices. The notification(s) can be transmitted via one or more networks (collectively network 152). The network 150 is illustrative of any suitable type of network, such as an intranet and/or a distributed computing network (e.g., the Internet).

Figure 2:
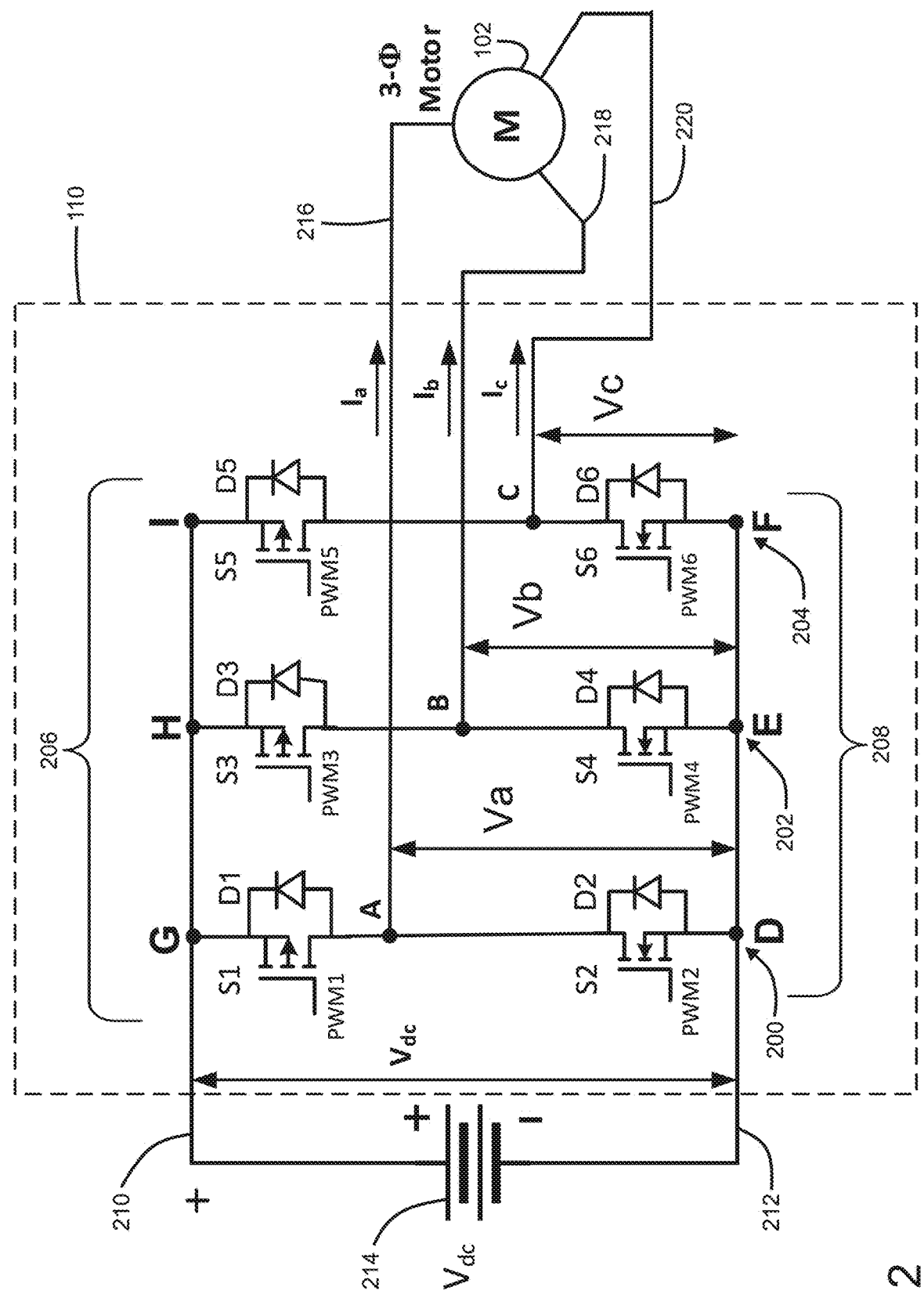
FIG. 2 is a schematic diagram illustrating a first example of the switching system shown in FIG. 1 in accordance with the principles of the present disclosure.

FIG. 2 is a schematic diagram illustrating a first example of the switching system shown in FIG. 1 in accordance with the principles of the present disclosure. The switching system 110 includes six switching devices S1-S6 that are distributed among three paths 200, 202, 204. The switching system 110 is configured in a six-pack topology of switching devices S1-S6. The switching system 110 can be used in three-phase applications, such as three-phase inverters, three-phase motor drivers, uninterruptable power supplies, and the like. The switching devices S1, S2 are connected in series and form the first path 200 of the switching system 110. The switching devices S3, S4 are connected in series and form the second path 202. The switching devices S5, S6 are connected in series and form the third path 204 of the switching system 110.

In the illustrated example, the switching devices S1, S3, S5 are implemented as p-type transistors, such as p-channel MOSFETs, and the switching devices S2, S4, S6 as n-type transistors, such as n-channel MOSFETs. Other examples are not limited to this implementation and other types of transistors may be used. Each switching device S1-S6 has a respective diode D1-D6 connected in anti-parallel across the drain and source terminals of the switching devices S1-S6. The diodes D1-D6 are any suitable type of diodes, such as p-n diodes or Schottky diodes.

The switching devices S1, S3, S5 are considered on the "high" side of the switching system 110 and collectively form a first set of switching devices 206. The switching devices S2, S4, S6 are considered on the "low" side of the switching system 110 and collectively form a second set of switching devices 208. The source terminals of the switching devices S1, S3, S5 and the anode terminals of the diodes D1, D3, D5 are operably connected together at nodes A, B, C, respectively. The drain terminals of the switching devices S2, S4, S6 and the cathode terminals of the diodes D2, D4, D6 are operably connected together at respective nodes A, B, C. The source terminals of the switching devices S2, S4, S6 and the anode terminals of the diodes D2, D4, D6 are operably connected together at nodes D, E, F, respectively. The drain terminals of the switching devices S1, S3, S5 and the cathode terminals of the diodes D1, D3, D5 are operably connected together at respective nodes G, H, I.

In particular, the source terminal of the switching device S1, the anode terminal of the diode D1, the drain terminal of the switching device S2, and the cathode terminal of the diode D2 are operably connected together at node A. The drain terminal of the switching device S1 and the cathode terminal of the diode D1 are operably connected together at node G. The source terminal of the switching device S2 and the anode terminal of the diode D2 are operably connected together at node D.

The source terminal of the switching device S3, the anode terminal of the diode D3, the drain terminal of the switching device S4, and the cathode terminal of the diode D4 are operably connected together at node B. The drain terminal of the switching device S3 and the cathode terminal of the diode D3 are operably connected together at node H. The source terminal of the switching device S4 and the anode terminal of the diode D4 are operably connected together at node E.

The source terminal of the switching device S5, the anode terminal of the diode D5, the drain terminal of the switching device S6, and the cathode terminal of the diode D6 are operably connected together at node C. The drain terminal of the switching device S5 and the cathode terminal of the diode D5 are operably connected together at node I. The source terminal of the switching device S6 and the anode terminal of the diode D6 are operably connected together at node F.

The gates of the switching devices S1, S3, S5 in the first set of switching devices 206 are operably connected to the PWM driver circuit 106 (FIG. 1) and receive input signals PWM1, PWM3, PWM5, respectively. The gates of the switching devices S2, S4, S6 in the second set of switching devices 208 are operably connected to the PWM driver circuit 106 (FIG. 1) and receive input signals PWM2, PWM4, PWM6, respectively.

The first, the second, and the third paths 200, 202, 204 are connected in parallel between the signal line 210 and the signal line 212. In particular, the first path 200 is operably connected between node G at the signal line 210 and node D at the signal line 212. The second path 202 is operably connected between node H at the signal line 210 and node E at the signal line 212. The third path 204 is operably connected between node I at the signal line 210 and node F at the signal line 212.

A voltage level Va is provided between node A and the signal line 212 (e.g., node D), a voltage level Vb is provided between node B and the signal line 212 (e.g., node E), and a voltage level Vc is provided between node C and the signal line 212 (e.g., node F). A DC power supply 214 is operably connected between the signal lines 210, 212. The DC power supply 214 provides a voltage level Vdc between the signal lines 210, 212.

The motor 102 (FIG. 1) is operably connected to nodes A, B, C through signal lines 216, 218, 220, respectively. A current signal Ia is transmitted on the signal line 216. A current signal Ib is transmitted on the signal line 218. A current signal Ic is transmitted on the signal line 220. As will be described in more detail in conjunction with FIG. 3, the values of Vdc, Va, Vb, Vc, Ia, Ib, Ic are used in the estimations of the RULs of the switching devices S1-S6.

Figure 3:
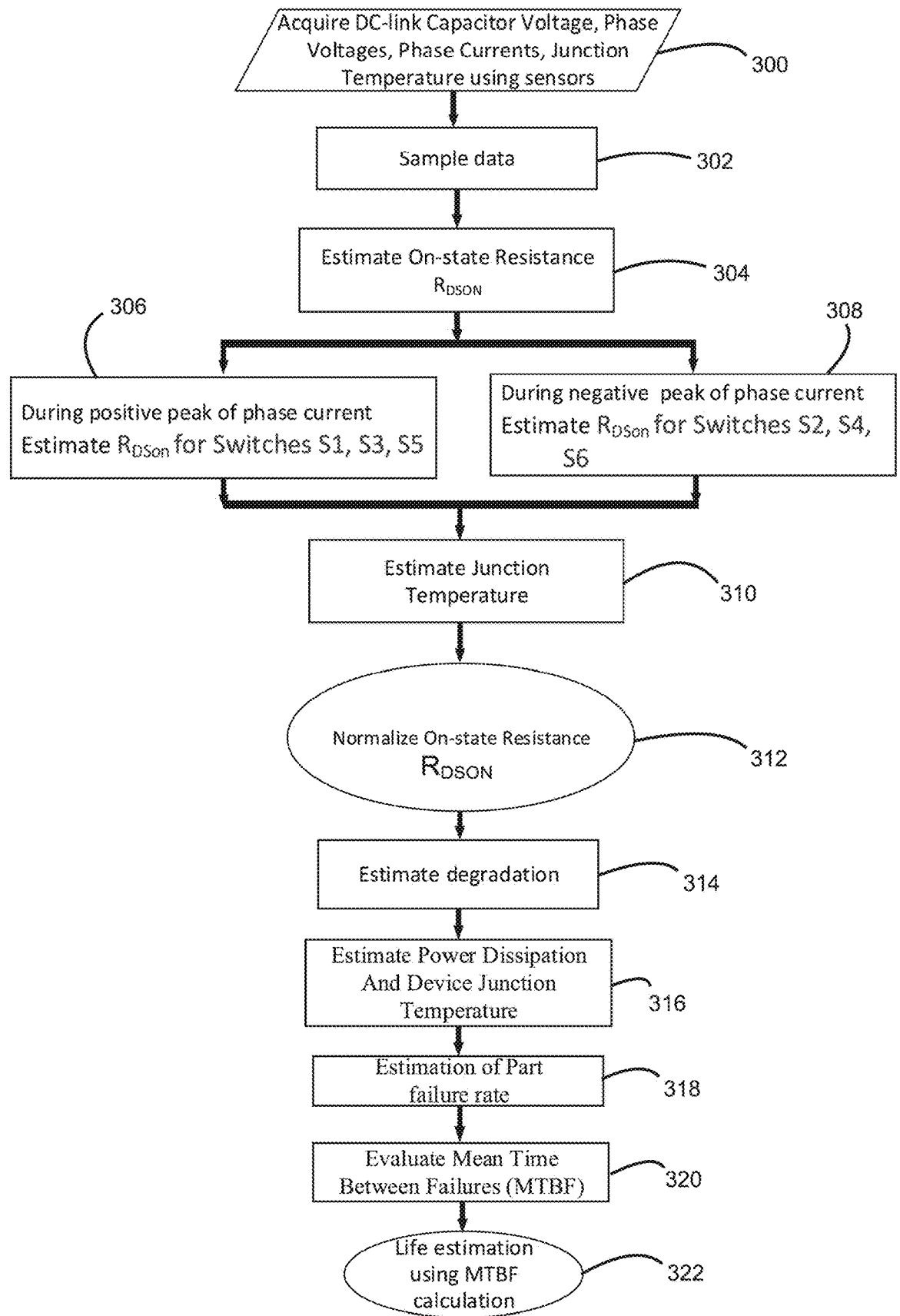
FIG. 3 is a flowchart illustrating an example method of estimating the remaining useful life of each switching device in the switching system shown in FIG. 2 in accordance with the principles of the present disclosure.
Figure 4:
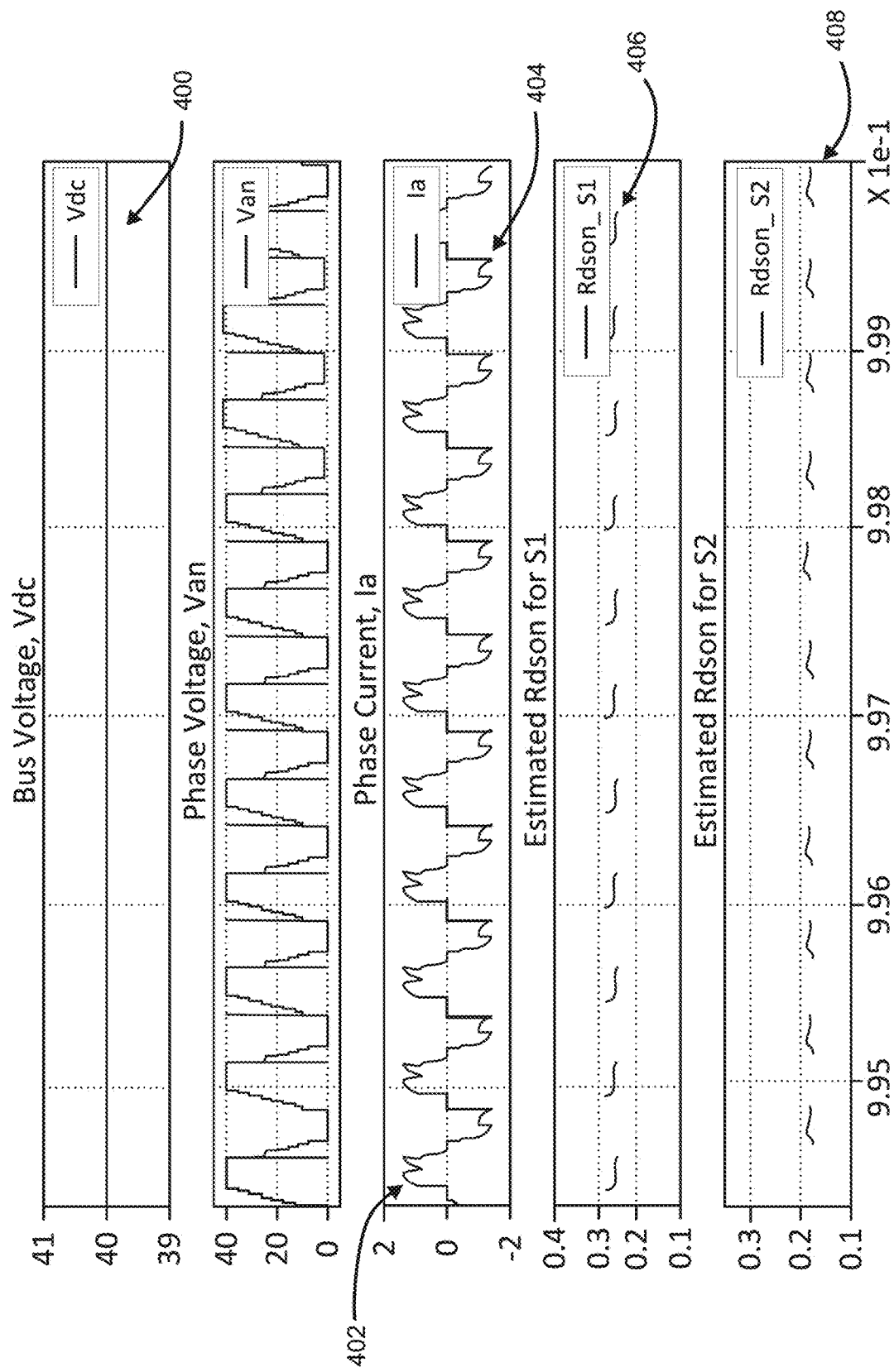
FIG. 4 illustrates example waveforms for switching system shown in FIG. 2 in accordance with the principles of the present disclosure.

FIG. 3 is a flowchart illustrating an example method of estimating the RULs of the switching devices in the switching system shown in FIG. 2 in accordance with the principles of the present disclosure. FIG. 3 is described in conjunction with FIG. 4, where FIG. 4 illustrates example waveforms for the switching system 110 shown in FIG. 2.

Initially, as shown in block 300, various parameters or values of the system, such as the control system of FIG. 1, are acquired. In one example, the values are the DC-link capacitor voltage Vdc (FIG. 2), the three-phase voltages Va, Vb, Vc (FIG. 2), the three-phase currents Ia, Ib, Ic (FIG. 2), and the junction temperatures (e.g., case/heat sink temperatures) of the switching devices. The values are acquired by the three-phase current sensor 112, the three-phase voltage sensor 114, the voltage sensor 124, and the temperature sensor 142 shown in FIG. 1. In one example, the values are acquired during continuous operation (c-bit) of the control system. In another example, the values are obtained during power on (p-bit) at the startup of the control system. As will be described in more detail later, the values are used to estimate the RULs of the switching devices S1-S6.

The sensed signals from the sensors in the system are sampled at block 302. In one example, the analog values are sampled by one or more analog-to-digital converters (e.g., ADC 138 in FIG. 1) either sequentially or simultaneously at a higher frequency than the switching frequency of the system. For example, the analog values can be sampled at twice (or higher) the switching frequency to account for the PWM nature of the analog signals.

At block 304, the on-state resistance $R_{DSON}$ for each of the switching devices S1-S6 is estimated using some of the digital values sampled in block 302. $R_{DSON}$ is estimated for each switching device S1, S3, S5 in the first set of switching devices 206 during the positive peaks of the three-phase currents Ia, Ib, Ic (block 306). $R_{DSON}$ is estimated for each switching device S2, S4, S6 in the second set of switching devices 208 during the negative peaks of the three-phase currents Ia, Ib, Ic (block 308).

FIG. 4 illustrates the Vdc voltage level 400, the positive peaks 402 of the phase current Ia, and the negative peaks 404 of the phase current Ia. At a positive peak 402 (FIG. 4) of the phase current Ia, the following equation is used to estimate $R_{DSON}$ for the switching device S1:

$$R_{DSON,S1} = \frac{v_{DS,S1}}{i_{DS,S1}} = \frac{V_{dc} - v_a}{i_a}, \qquad \text{Equation (1)}$$

where Ia represents the peak of the positive half-cycle of the phase current Ia, $V_{DS,S1}$=(Vdc−Va), and $I_{DS,S1}$=Ia. An example estimated $R_{DSON}$ 406 for the switching device S1 is shown in FIG. 4. Although Equation (1) is described in conjunction with the switching device S1, the phase voltage Va, and the phase current Ia, Equation (1) is also used to estimate $R_{DSON}$ for the switching devices S3, S5. For the switching device S3, the phase voltage Va in Equation (1) is replaced with the phase voltage Vb and the phase current Ia in Equation (1) is replaced with the phase current Ib. Similarly, for the switching device S5, the phase voltage Va in Equation (1) is replaced with the phase voltage Vc and the phase current Ia in Equation (1) is replaced with the phase current Ic.

At a negative peak 404 (FIG. 4) of the phase current Ia, $R_{DSON}$ is estimated for the switching device S2 using the following equation:

$$R_{DSON,S2} = \frac{v_{DS,S2}}{i_{DS,S2}} = \frac{v_a}{-i_a}, \qquad \text{Equation (2)}$$

where Ia represents the peak of the negative half-cycle of the phase current Ia, $V_{DS,S2}$=Va, and $I_{DS,S2}$=negative Ia (−Ia). An example estimated $R_{DSON}$ 408 for the switching device S2 is shown in FIG. 4. Like Equation (1), Equation (2) is also used to estimate $R_{DSON}$ for the switching devices S4, S6. For the switching device S4, the phase voltage Va in Equation (2) is replaced with the phase voltage Vb and the phase current Ia in Equation (2) is replaced with the phase current Ib. Similarly, for the switching device S6, the phase voltage Va in Equation (2) is replaced with the phase voltage Vc and the phase current Ia in Equation (2) is replaced with the phase current Ic.

After estimating $R_{DSON}$ for each switching device S1-S6, the junction temperature of each switching device S1-S6 is estimated at block 310. In one example, the junction temperature is estimated using the temperature measurement acquired by the temperature sensor 142 in FIG. 1.

Next, as shown in block 312, the estimated $R_{DSON}$ values are normalized with respect to the operating point of the system. Normalization is performed to reduce or eliminate the effect of variations in the operating point such as variations in the supply voltage VDc, the supply current Is, the device junction temperature, and the like. The variations in the operating point can lead to an increase in the estimated $R_{DSON}$.

The degradation of the switching devices S1-S6 is estimated at block 314. In one example, the operations of blocks 316, 318, 320 are executed to estimate the degradation of the switching device. In some instances, the degradation can reduce the MTBF.

The power dissipation and the junction temperature of each switching device are estimated at block 316. In one example, the power dissipation (P) and the junction temperature ($T_j$) are estimated using the following equations:

$$P = I^2 R_{DSON}, \quad \text{Equation (3)}$$

$$T_j = T_c + \theta jc P, \quad \text{Equation (4)}$$

where Tc represents the case temperature. θjc is the junction to case thermal resistance, and I represents the current Ia (for switching devices S1 and S2), Ib (for switching devices S3 and S4), or Ic (for switching devices S5 and S6). The part failure rate is then estimated at block 318. In one example, the part failure rate corresponds to the device junction temperature and is calculated using known standard failure rate equations and/or manufacturer failure rate equations. In a non-limiting nonexclusive example, the following equations are used to estimate the part failure rate:

$$\lambda_P = \lambda_b \pi_T \pi_Q \pi_A \pi_E \quad \text{Equation (5)}$$

$$\pi_T = f(T_j, R_{DSON}), \quad \text{Equation (6)}$$

where $\lambda_b$ represents a base failure rate, $\pi_T$ represents a temperature factor, $\pi_Q$ represents a quality factor, $\pi_A$ represents an application factor, $\pi_E$ represents an environmental factor, and $\pi_T$ represents a temperature factor as a function of $T_j$. In one example, the junction temperature $T_j$ estimated with Equation (4) and the junction temperature estimated at block 310 are compared to each other and the appropriate junction temperature is used in Equations (5), (6), and (7). In some instances, the junction temperatures may deviate from one another to a point where one junction temperature, such as the junction temperature that is based on the temperature sensed by the temperature sensor 142 in FIG. 1, is used in Equations (5), (6), and (7) and the other junction temperature (e.g., the estimated junction temperature $T_j$) is not used in Equations (5), (6), and (7). In one example, the temperature factor corresponds to the junction temperature $T_j$ and is computed using the following equation:

$$\pi_T = e^{-1925\left(\frac{1}{T_j+273} - \frac{1}{298}\right)} \quad \text{Equation (7)}$$

At block 320, the MTBF is estimated for each switching device. In one example, due to wear-out failures, an exponential distribution is assumed and the MTBF is estimated as inverse of failure rate.

$$MTBF = \frac{1}{\lambda_P} \quad \text{Equation (8)}$$

In some examples, the MTBF estimation is performed online (e.g., via a cloud computing system). This is due in part to the processing device (e.g., processing device 140 in FIG. 1) not possessing higher computational capabilities and the estimation of the RULs of switching devices are not complex calculations. In other examples, the MTBF estimation is performed by locally (e.g., on site), such as when the processing device has higher computational capability to execute complex data-driven-based RUL algorithms (e.g., Kalman filters and extended Kalman filters).

The RUL of each of the switching devices S1-S6 is estimated at block 322. In one example, the estimated MTBF is used for the estimated RUL. In general, as a switching device wears out due to aging, the $R_{DSON}$ of the switching device increases and the MTBF and the RUL of the switching device decrease.

Figure 8:
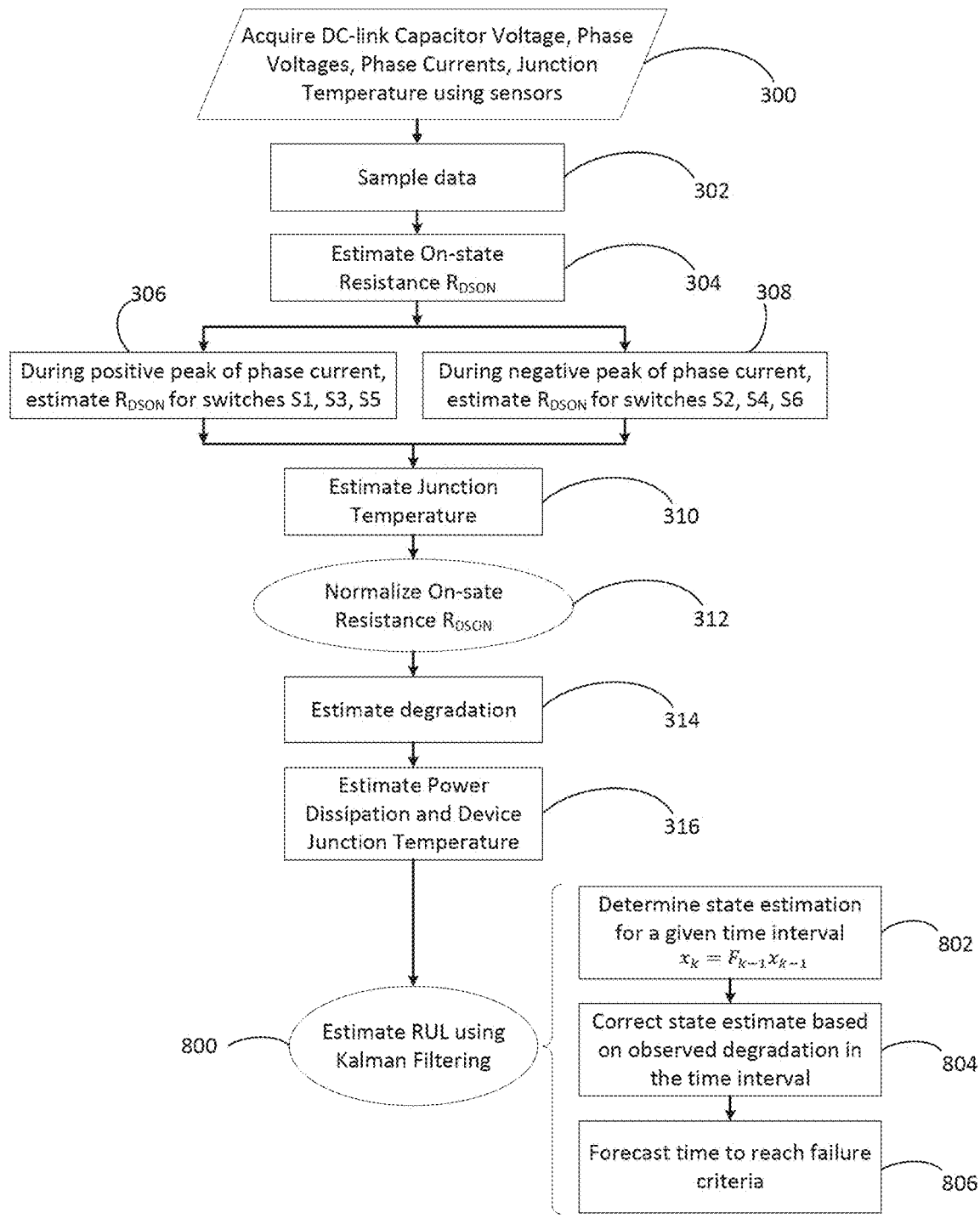
FIG. 8 illustrates a flowchart illustrating another example method of estimating the remaining useful life of each switching device in the switching system shown in FIG. 2 in accordance with the principles of the present disclosure.

While blocks 300-322 of FIG. 3 describe an example method of estimating the RULs of the switching devices in the switching system shown in FIG. 2 using MTBF calculations, an alternate method of estimating the RULs of the switching devices in the switching system shown in FIG. 2 using Kalman filtering of degradation trends is described in detail in relation to FIG. 8.

Figure 5:
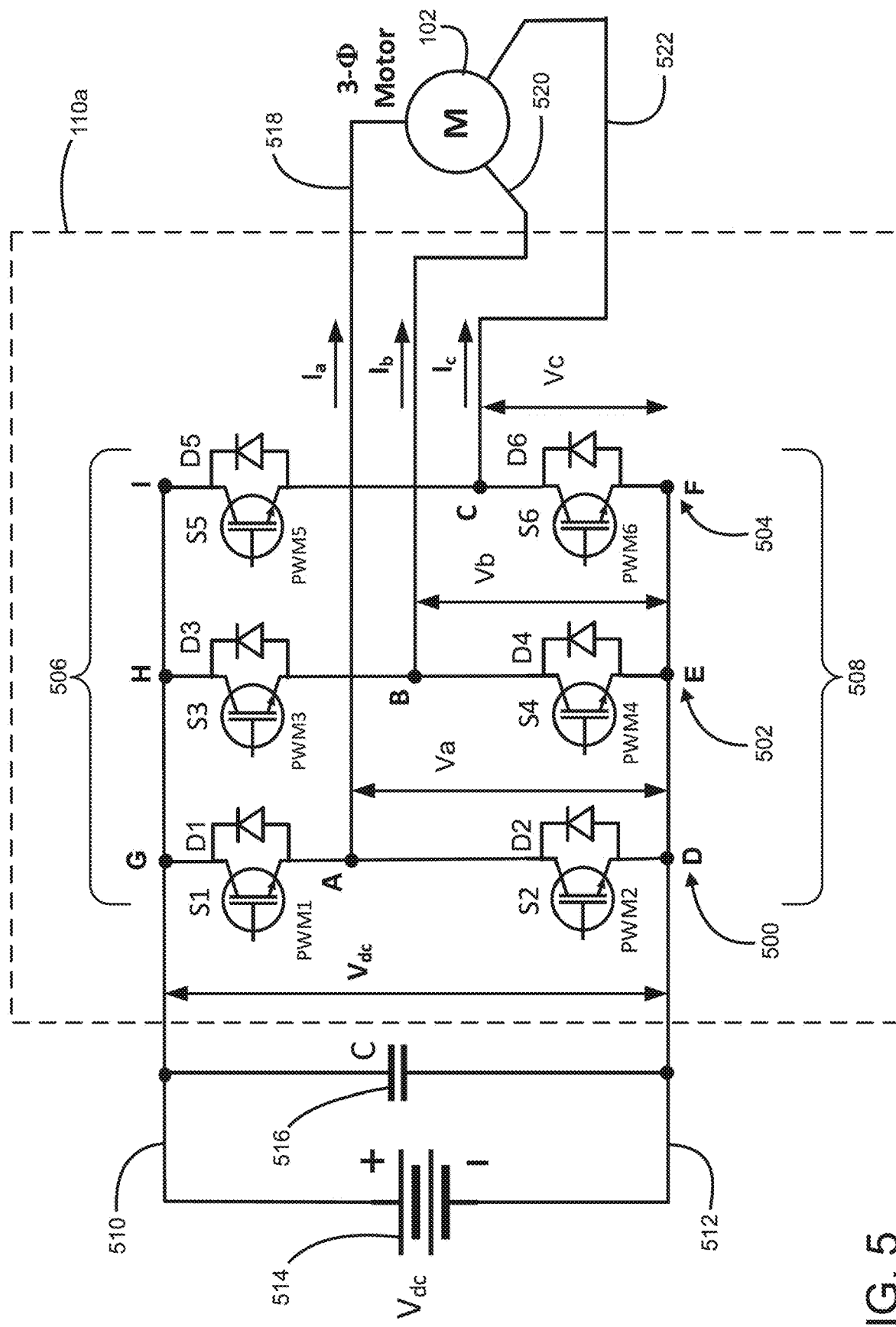
FIG. 5 is a schematic diagram illustrating a second example of the switching system shown in FIG. 1 in accordance with the principles of the present disclosure.

As noted earlier, other types of transistors can be used in the switching system 110 shown in FIG. 1. FIG. 5 is a schematic diagram illustrating a second example of the switching system $110_a$, where the switching system $110_a$ is implemented with IGBTs. Like FIG. 2, the switching system $110_a$ includes six switching devices S1-S6 that are distributed among three paths 500, 502, 504. The switching devices S1, S2 are connected in series and form the first path 500 of the switching system $110_a$. The switching devices S3, S4 are connected in series and form the second path 502. The switching devices S5, S6 are connected in series and form the third path 504 of the switching system $110_a$.

Each switching device S1-S6 has a respective diode D1-D6 connected in anti-parallel across the collector and the emitter terminals of the switching devices S1-S6. The diodes D1-D6 are any suitable type of diodes, such as p-n diodes or Schottky diodes.

The switching devices S1, S3, S5 are considered on the "high" side of the switching system $110_a$ and collectively form a first set of switching devices 506. The switching devices S2, S4, S6 are considered on the "low" side of the switching system $110_a$ and collectively form a second set of switching devices 508. The emitter terminals of the switching devices S1, S3, S5 and the anode terminals of the diodes D1, D3, D5 are operably connected together at nodes A, B, C, respectively. The collector terminals of the switching devices S2, S4, S6 and the cathode terminals of the diodes D2, D4, D6 are operably connected together at respective nodes A, B, C. The emitter terminals of the switching devices S2, S4, S6 and the anode terminals of the diodes D2, D4, D6 are operably connected together at nodes D, E, F, respectively. The collector terminals of the switching devices S1, S3, S5 and the cathode terminals of the diodes D1, D3, D5 are operably connected together at respective nodes G, H, I.

In particular, the emitter terminal of the switching device S1, the anode terminal of the diode D1, the collector terminal of the switching device S2, and the cathode terminal of the diode D2 are operably connected together at node A. The collector terminal of the switching device S1 and the cathode terminal of the diode D1 are operably connected together at node G. The emitter terminal of the switching device S2 and the anode terminal of the diode D2 are operably connected together at node D.

The emitter terminal of the switching device S3, the anode terminal of the diode D3, the collector terminal of the switching device S4, and the cathode terminal of the diode D4 are operably connected together at node B. The collector terminal of the switching device S3 and the cathode terminal of the diode D3 are operably connected together at node H. The emitter terminal of the switching device S4 and the anode terminal of the diode D4 are operably connected together at node E.

The emitter terminal of the switching device S5, the anode terminal of the diode D5, the collector terminal of the switching device S6, and the cathode terminal of the diode D6 are operably connected together at node C. The collector terminal of the switching device S5 and the cathode terminal of the diode D5 are operably connected together at node I. The emitter terminal of the switching device S6 and the anode terminal of the diode D6 are operably connected together at node F.

The gates of the switching devices S1, S3, S5 in the first set of switching devices 506 are operably connected to the PWM driver circuit 106 (FIG. 1) and receive input signals PWM1, PWM3, PWM5, respectively. The gates of the switching devices S2, S4, S6 in the second set of switching devices 508 are operably connected to the PWM driver circuit 106 (FIG. 1) and receive input signals PWM2, PWM4, PWM6, respectively.

The first, the second, and the third paths 500, 502, 504 are connected in parallel between the signal line 510 and the signal line 512. In particular, the first path 500 is operably connected between node G at the signal line 510 and node D at the signal line 512. The second path 502 is operably connected between node H at the signal line 510 and node E at the signal line 512. The third path 504 is operably connected between node I at the signal line 510 and node F at the signal line 512.

A voltage level Va is provided between node A and the signal line 512 (e.g., node D), a voltage level Vb is provided between node B and the signal line 512 (e.g., node E), and a voltage level Vc is provided between node C and the signal line 512 (e.g., node F). A DC power supply 514 and a capacitor 516 are operably connected between the signal lines 510, 512. The DC power supply 514 provides a voltage level Vdc between the signal lines 510, 512.

The motor 102 (FIG. 1) is operably connected to nodes A, B, C through signal lines 518, 520, 522, respectively. A current signal Ia is transmitted on the signal line 518. A current signal Ib is transmitted on the signal line 520. A current signal Ic is transmitted on the signal line 522. As will be described in more detail in conjunction with FIG. 6, the values of Vdc, Va, Vb, Vc, Ia, Ib, Ic are used in the estimation of the RULs of the switching devices S1-S6.

Figure 6:
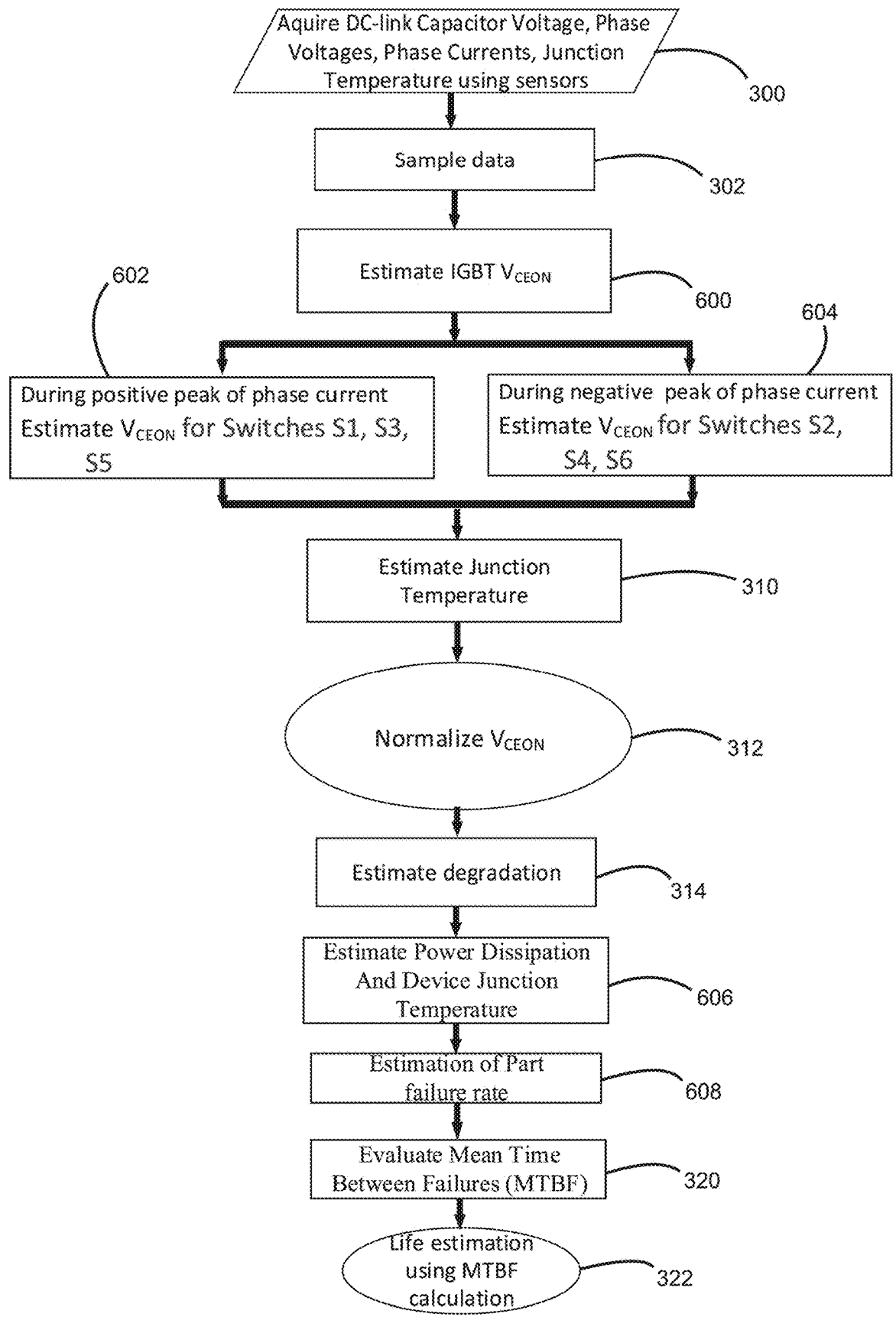
FIG. 6 is a flowchart illustrating an example method of estimating the remaining useful life of each switching device in the switching system shown in FIG. 5 in accordance with the principles of the present disclosure.

FIG. 6 is a flowchart illustrating an example method of estimating the RULs of the switching devices in the switching system shown in FIG. 5 in accordance with the principles of the present disclosure. Some of the blocks in FIG. 6 are similar to blocks depicted in FIG. 3. The same reference numbers are used for these blocks and, for brevity, the blocks are not described in detail.

Initially, as shown in block 300, various values of the system are acquired. In one example, the values are the DC-link capacitor voltage Vdc (FIG. 5), the three-phase voltages Va, Vb, Vc (FIG. 5), the three-phase currents Ia, Ib, Ic (FIG. 5), and the junction temperatures (e.g., case/heat sink temperatures). The sensors in the control system (e.g., control system 100) are sampled at block 302 to acquire the values.

At block 600, the on-state voltage $V_{CEON}$ for each of the switching devices S1-S6 is estimated using digital values sampled in block 302. $V_{CEON}$ is estimated for each switching device S1, S3, S5 in the first set of switching devices 506 during the positive peaks of the three-phase currents Ia, Ib, Ic (block 602). $V_{CEON}$ is estimated for each switching device S2, S4, S6 in the second set of switching devices 508 during the negative peaks of the three-phase currents Ia, Ib, Ic (block 604).

At a positive peak of the phase current Ia, $V_{CEON,S1}$= (Vdc−Va), and $I_{CEON,S1}$=Ia. The following equation is used to estimate $V_{CEON}$ for the switching device S1:

$$v_{CEON,S1} = (v_{dc} - v_a) = V_{J,S1} + (i_a R_{ON,S1}) \qquad \text{Equation (9)}$$

$$R_{ON,S1} = \frac{\Delta v_{CEON,S1}}{\Delta i_{CEON,S1}} \qquad \text{Equation (10)}$$

where $R_{ON,S1}$ represents the on-state resistance of the switching device S1. $R_{ON,S1}$ is estimated at the positive peak of the positive half-cycle of the phase current Ia. The variable $V_{J,S1}$ represents the forward voltage of the switching device S1. The forward voltage is estimated at the zero crossing of the phase current Ia.

Although Equation (9) is described in conjunction with the switching device S1 and the phase current Ia, Equation (9) is also used to estimate $V_{CEON}$ for the switching devices S3, S5. For the switching device S3, the phase current Ia in Equation (9) is replaced with the phase current Ib. Additionally, $R_{ON,S3}$ is estimated at the positive peak of the positive half-cycle of the phase current Ib. The variable $V_{J,S3}$ is estimated at the zero crossing of the phase current Ib.

Similarly, for the switching device S5, the phase current Ia in Equation (9) is replaced with the phase current Ic. $R_{ON,S5}$ is estimated at the positive peak of the positive half-cycle of the phase current Ic. The variable $V_{J,S5}$ is estimated at the zero crossing of the phase current Ic.

At a negative peak of the phase current Ia, $V_{CEON,S1}$=Va, and $I_{CEON,S1}$=−Ia. The following equation is used to estimate $V_{CEON}$ for the switching device S2:

$$v_{CEON,S2} = v_a = V_{J,S2} + (-i_a R_{ON,S2}), \qquad \text{Equation (11)}$$

$$R_{ON,S2} = \frac{\Delta v_{CEON,S2}}{\Delta i_{CEON,S2}} \qquad \text{Equation (12)}$$

where $R_{ON,S2}$ represents the on-state resistance of the switching device S2. $R_{ON,S2}$ is estimated at the negative peak of the negative half-cycle of the phase current Ia. The variable $V_{J,S2}$ represents the forward voltage of the switching device S2. The forward voltage is estimated at the zero crossing of the phase current Ia.

Equation (11) is also used to estimate $V_{CEON}$ for the switching devices S4, S6. For the switching device S4, the phase current Ia in Equation (11) is replaced with the phase current Ib. Additionally, $R_{ON,S4}$ is estimated at the negative peak of the negative half-cycle of the phase current Ib. $V_{J,S4}$ is estimated at the zero crossing of the phase current Ib.

Similarly, for the switching device S6, the phase current Ia in Equation (11) is replaced with the phase current Ic. $R_{ON,S6}$ is estimated at the negative peak of the negative half-cycle of the phase current Ic. The variable $V_{J,S6}$ is estimated at the zero crossing of the phase current Ic.

After estimating $V_{CEON}$ for each switching device S1-S6, the junction temperature is estimated at block 310. The estimated $V_{CEON}$ values are then normalized with respect to the operating point (e.g., the junction temperature, the supply voltage Is, and the current Is) at block 606. At block 314, the degradation of each of the switching devices S1-S6 is estimated. In one example, the operations of blocks 608, 610, 320 are executed to estimate the degradation of the switching device. In some instances, the degradation can reduce the MTBF.

The power dissipation and the device junction temperature are estimated at block 608. In one example, the power dissipation (P) and the junction temperature ($T_j$) are estimated using the following equations:

$$P = I_c V_{CEON} \quad \text{Equation (13)}$$

$$T_j = T_a + \theta ja P, \quad \text{Equation (14)}$$

where Ta represents the ambient temperature and θja is the junction to ambient thermal resistance. In one example, the junction temperature $T_j$ estimated with Equation (14) and the junction temperature estimated at block 310 are compared to each other and the appropriate junction temperature is used in Equation (15). In some instances, the junction temperatures may deviate from one another to a point where one junction temperature, such as the junction temperature that is based on the temperature sensed by the temperature sensor 142 in FIG. 1, is used in Equation (15) and the other junction temperature (e.g., the estimated junction temperature $T_j$) is not used in Equation (15).

The part failure rate for the switching devices is then estimated at block 610. In one example, the part failure rate corresponds to the device junction temperature and is calculated using known standard failure rate equations and/or manufacturer failure rate equations. In a non-limiting non-exclusive example, Equation (5) and the following Equation (15) are used to estimate the part failure rate:

$$\pi_T = f(T_j, V_{CEON}), \quad \text{Equation (15)}$$

where $\pi_T$ represents a temperature factor that is a function of $T_j$. In one example, the temperature factor is computed using Equation (7).

At block 320, the Mean Time Between Failures (MTBF) is estimated. The RUL of each switching device S1-S6 is then estimated at block 322. In one example, the estimated MTBF is used for the estimated RUL. In general, as a switching device wears out due to aging, the $V_{CEON}$ of the switching device increases and the MTBF and the RUL of the switching device decrease.

Figure 9:
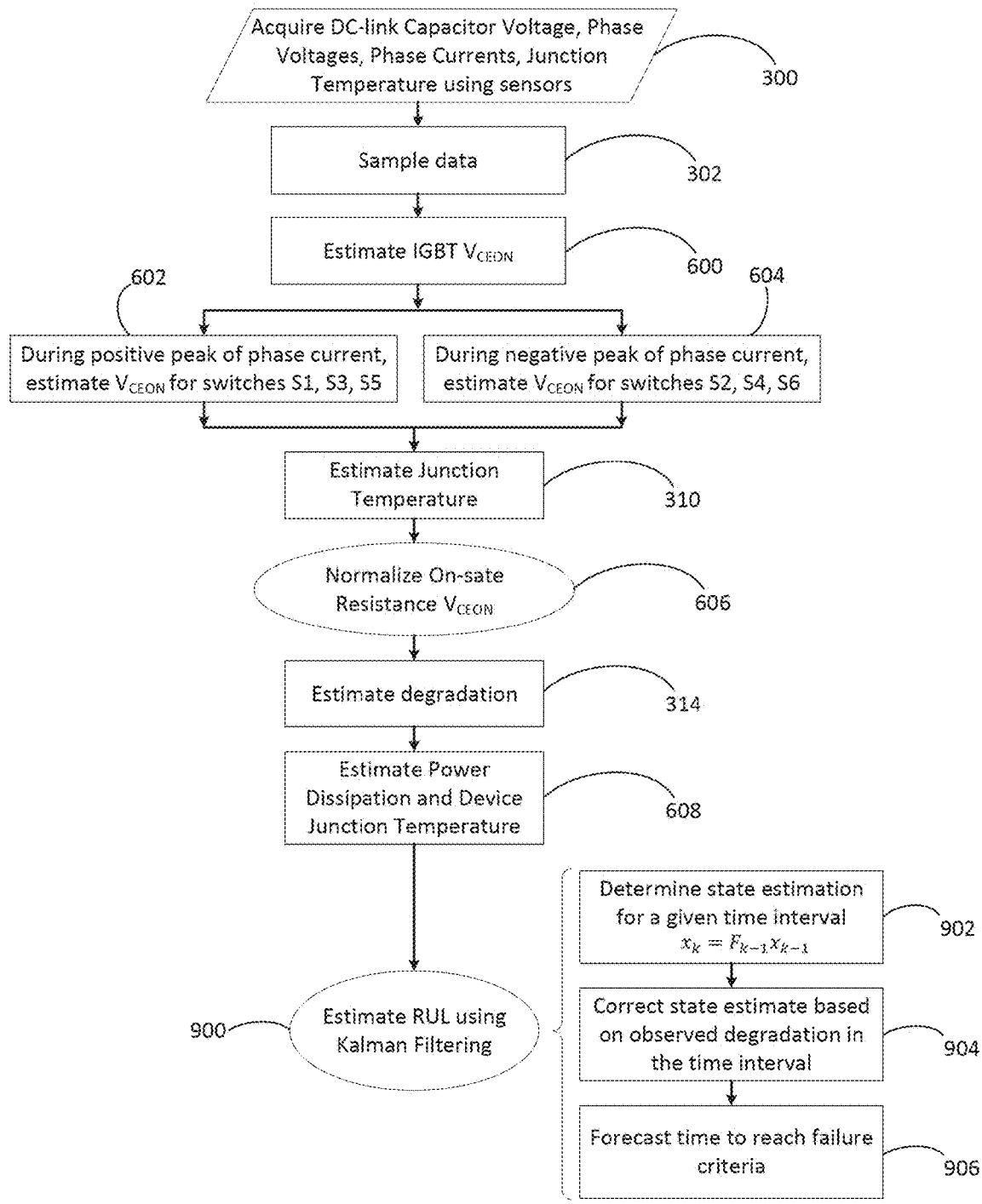
FIG. 9 is a flowchart illustrating another example method of estimating the remaining useful life of each switching device in the switching system shown in FIG. 5 in accordance with the principles of the present disclosure.

While FIG. 6 describe an example method of estimating the RULs of the switching devices in the switching system shown in FIG. 5 using MTBF calculations, an alternate method of estimating the RULs of the switching devices in the switching system shown in FIG. 5 using Kalman filtering of degradation trends is described in detail in relation to FIG. 9.

Figure 7:
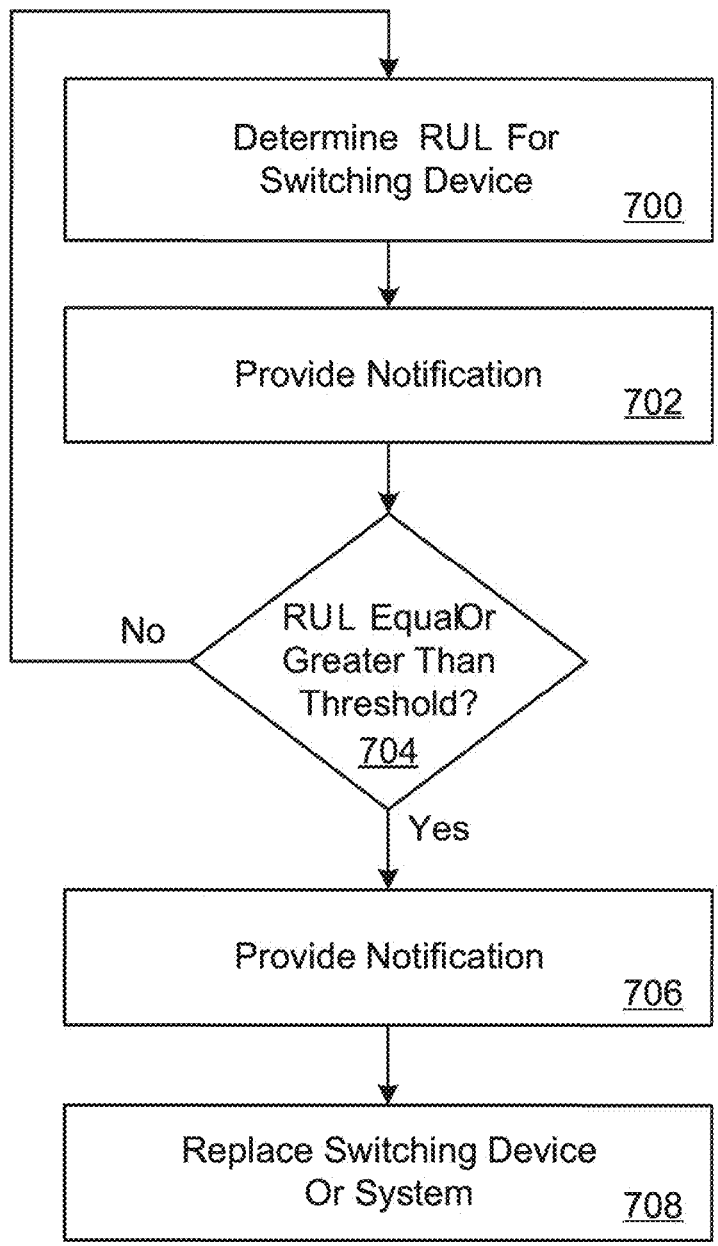
FIG. 7 illustrates a flowchart of a method of monitoring the RUL of a switching device in accordance with the principles of the present disclosure.

FIG. 7 illustrates a flowchart of a method of monitoring the RUL of a switching device in accordance with the principles of the present disclosure. Although the method is described in conjunction with one switching device, the method can be performed for all of the switching devices in a system. The method may be performed simultaneously or sequentially for the switching devices. Additionally, the method can be performed continuously, at select times, or upon request. In one example, the method is performed by the processing device 140 shown in FIG. 1.

Initially, as shown in block 700, the RUL of the switching device is determined. Based on the type of switching device, the RUL may be determined using the techniques disclosed herein. One or more notifications associated with the RUL are provided at block 702. In one example, the notification includes information such as an identifier of the switching device and the RUL determined at block 700. For example, a notification that includes the RUL, and estimated time at which the switching device may reach a failure criteria may be displayed at a display device. Additionally or alternatively, a notification can be transmitted to one or more output devices. Example notifications include, but are not limited to, an electronic email message, a text message, a visual message, an audio message (e.g., a sound or an alert), and a telephone call.

Next, as shown in block 704, a determination is made as to whether the RUL determined at block 700 is equal to or greater than one or more threshold RULs. In one example, a threshold RUL indicates a minimum RUL (e.g., that represents the end of the useful life of the switching device). If a determination is made that the RUL determined at block 700 is less than the threshold RUL, the process returns to block 704. When a determination is made at block 704 that the RUL is equal to or greater than the threshold RUL, the method continues at block 706 where one or more notifications are provided. In one example, the notification includes information such as an identifier of the switching device, the RUL determined at block 700, and the threshold RUL. For example, the RUL may be displayed at a display device. Additionally or alternatively, the notification can be transmitted to one or output devices.

In some examples, the display of the RUL, the type of notification, and/or the number of notifications that are sent are based on the RUL determined at block 700. For example, if the RUL is within a first range of RULs that indicate the switching device is not near the end of the useful life, an electronic mail may be sent and/or the RUL is displayed in a first presentation (e.g., the size, the color, and/or the type of font indicate acceptable RUL). If the RUL is within a second range of RUL values that indicate the switching device is nearing the end of useful life, an electronic mail and a text message may be sent and/or the RUL is displayed in a second presentation (e.g., the size, the color, and/or the type of font indicates near the end of the RUL). If the RUL is within a third range of RUL values that indicate the switching device is at the end of useful life (or imminent end of life), a telephone call may be made and/or the RUL is displayed in a third presentation (e.g., the size, the color, and/or the type of font indicates the end of the RUL).

The notification(s) provided at block 706 cause an action to be performed, such as the replacement of the switching device, a circuit board on which the switching device is attached, or the system that includes the switching device. For example, the circuit board that includes the switching device that is identified as at or very near the end of the useful life can be replaced with a new circuit board that includes a new switching device. Alternatively, in some systems, the switching device itself is replaced. In some examples, the switching device is part of a system, such as a system that is enclosed in a housing, and the housing is replaced with a new housing.

Implementations of the present invention are not limited to the flowchart shown in FIG. 7. In other examples, the operations noted in the blocks of FIG. 7 may occur out of the illustrated order or certain blocks can be omitted. For example, block 702 may be omitted in some systems. Additionally or alternatively, two blocks shown in succession may in fact be executed concurrently or substantially concurrently, depending upon the functionality/acts involved. In a non-limiting example, blocks 702 and 704 can be performed concurrently or substantially concurrently.

FIG. 8 is a flowchart illustrating another example method of estimating the RULs of the switching devices in the switching system shown in FIG. 2 in accordance with the principles of the present disclosure. While FIG. 3 discloses the life estimation process using MTBF calculations, FIG. 8 illustrates an alternate example of estimating the RULs of the switching devices in the switching system shown in FIG.

2 using Kalman filtering on degradation trends in order to predict when a switching device may reach a failure criterion.

Some of the blocks in FIG. 8 are similar to blocks depicted in FIG. 3. For example, the same reference numbers are used for blocks 300-316 in FIG. 8 and, for brevity, the blocks are not described in detail.

As described above in relation to FIG. 3, The degradation of the switching devices S1-S6 is estimated at block 314. The health signature ($V_{CEON}$ for IGBT devices or $R_{DSON}$ for MOSFET devices) at start of life is stored and the percentage change of the health signature is continuously tracked and is called as degradation or degradation trend. The degradation of a device may be affected by various factors including the usage profile of the product in the field by the customer.

The power dissipation and the junction temperature of each switching device are estimated at block 316. In one example, the power dissipation (P) and the junction temperature ($T_j$) are estimated using equations (3) and (4). The power dissipation and junction temperature information is used for normalization of the health signature with respect to a pre-defined temperature such as 25C ambient condition. The normalized health signature is then used as input for estimating the health state and RUL.

In block 800, the RUL of each of the switching device S1-S6 may be estimated using a Kalman filter. For example, Kalman filtering is a statistical algorithm that uses a series of measurements observed over time to produce estimates of unknown variables by estimating a joint probability distribution over the variables for each timeframe. In the example of estimating the end of life for each of the switching devices S1-S6, Kalman filtering is used to model the degradation trend of each of the switching devices S1-S6 and predict the time at which each of the switching devices S1-S6 reach a pre-defined future health state at which the switching devices S1-S6 must be replaced.

The RUL estimations are periodically performed over the course of the life of each of the switching devices S1-S6. The frequency with which the RUL estimations are performed may be defined at uniform intervals or may be calculated based on the previously calculated RUL values. For example, the frequency with which the RUL of the switching device S1-S6 is estimated may be increased as the previously estimated RUL value for the switching devices S1-S6 decreases.

The RUL estimation process itself is defined further in blocks 802, 804, and 806 and is described in further detail below.

In block 802, the estimated degradation value from block 314 may be used to calculate a health state of each of the switching devices S1-S6 for a given time interval. For example, the estimated degradation value from block 314 may include a health signature of each of the switching device S1-S6. The health signature for a MOSFET switching device is based on the normalized $R_{DSON}$ value from block 312. In addition to a health signature for each of the switching devices S1-S6, the degradation value estimate from block 314 may also include a time at which the degradation value was estimated and rate of change of the health signature value from an initial health signature value that was calculated at the beginning of the life the switching devices S1-S6. Based on the received degradation value, the time at which the degradation value was calculated in block 314, and the rate of change of the health signature value for each of the switching devices S1-S6 compared to the initial health signature value for the switching devices S1-S6, the health state of the switching devices S1-S6 may be estimated for a particular time.

For example, the health state of the switching devices S1-S6 for a particular time interval can be estimated using a polynomial plant model. For example, a polynomial plant model may use Kalman filtering methodologies to model the historical degradation trends over time in order to estimate the health state of the switching devices S1-S6 at a particular time. An example equation to estimate the health state for a particular time is:

$$X_t = F_{t-1} x_{t-1} \qquad \text{Equation (16)}$$

wherein, $x_t$ represents the health state of the switching devices S1-S6 at a particular time interval "t"; $x_{t-1}$ represents the health state of the switching devices S1-S6 at a previous time interval "t−1"; and $F_{t-1}$ represents a health state estimation matrix that represents the rate at which degradation is happening based on the historical trends in degradation from previous degradation state measurements. The health state estimation matrix may be calculated by using historical health state data from previous iterations of health state calculations. A detailed version of Equation 16 below may be further represented as:

$$\begin{bmatrix} x_t \\ \dot{x}_t \end{bmatrix} = \begin{bmatrix} 1 & \Delta t \\ 0 & 1 \end{bmatrix} \begin{bmatrix} x_{t-1} \\ \dot{x}_{t-1} \end{bmatrix} \qquad \text{Equation (17)}$$

wherein, $x_t$ from Equation 16 can be represented as $$\begin{bmatrix} x_t \\ \dot{x}_t \end{bmatrix};$$

$F_{t-1}$, the health state estimation matrix from Equation 16 can be represented by $$\begin{bmatrix} 1 & \Delta t \\ 0 & 1 \end{bmatrix}$$

and $x_{t-1}$ from Equation 16 can be represented by $$\begin{bmatrix} x_{t-1} \\ \dot{x}_{t-1} \end{bmatrix}.$$

In block 804, the state estimate matrix equation (Equation (17)) from block 802 may be corrected based on observed degradation in the time interval. For example, as described above, the RUL estimation process in blocks 300-316 and 800-806 are repeated periodically. During each iteration of RUL estimation for a switching device, the state estimation matrix equation (Equation (17)) from block 802 is adjusted based on the actual rate of degradation measured at the particular time interval to ensure that the state estimation matrix equation is as accurate as possible. Thus, each iteration of estimating the RUL would make the state estimation matrix equation more accurate. For example, Equation 17 may provide the expected degradation at a future time interval $\Delta t$. Based on the rate of change of the health signature, the observed degradation may be calculated at the end of the time interval $\Delta t$. Based on the observed degradation, degradation state $x_t$ in Equation 16 may be corrected.

In block 806, the corrected state estimation matrix equation from block 804 can be used to forecast a time at which the switching devices S1-S6 reach a failure criterion. For example, a failure criterion may be defined as degradation state at which the switching devices S1-S6 are operationally deficient. In some examples, operationally deficient may be defined as degradation state at which a switching device from the switching devices S1-S6 has a health index value that has dropped down to a predetermined threshold value. For example, a predetermined threshold value may be 80% of the initial health index value. The initial health index value of a switching device may include the health index value that was calculated for the switching device when the switching device was first measured. In such a case, the corrected state estimation matrix equation from block 804 may be used to determine the time at which a switching device reaches a failure criterion, which may be defined as when the health index of the switching device reaches 80% of the initial health index value.

The estimated RUL, including the forecasted time at which each of the switching devices S1-S6 is estimated to reach a failure criterion, may be used to create a notification system as further described in FIG. 7.

FIG. 9 is a flowchart illustrating another example method of estimating the RULs of the switching devices in the switching system shown in FIG. 5 in accordance with the principles of the present disclosure. While FIG. 6 discloses the life estimation process using MTBF calculations, FIG. 9 illustrates an alternate example of estimating the RULs of the switching devices in the switching system shown in FIG. 5 using Kalman filtering on degradation trends in order to predict when a switching device may reach a failure criterion.

After estimating $V_{CEON}$ for each switching device S1-S6, the junction temperature is estimated at block 310. The estimated $V_{CEON}$ values are then normalized with respect to the operating point (e.g., the junction temperature, the supply voltage Is, and the current Is). At block 314, the degradation of each of the switching devices S1-S6 is estimated. The power dissipation and the device junction temperature are estimated at block 608 using equations (13) and (14).

In block 902, the estimated degradation value from block 314 may be used to calculate a degradation state of each of the switching devices S1-S6 for a given time interval. For example, the estimated degradation value from block 314 may include a health signature of each of the switching device S1-S6. The health signature for a IGBT switching device is based on the normalized $V_{CEON}$ value from block 606. In addition to a health signature for each of the switching devices S1-S6, the degradation value estimate from block 314 may also include a time at which the degradation value was estimated and rate of change of the health signature value from an initial health signature value that was calculated at the beginning of the life the switching devices S1-S6. Based on the received degradation value, the time at which the degradation value was calculated in block 314, and the rate of change of the health signature value for each of the switching devices S1-S6 compared to the initial health signature value for the switching devices S1-S6, the degradation state of the switching devices S1-S6 may be estimated for a particular time interval.

For example, the degradation state of the switching devices S1-S6 for a particular time interval can be estimated using a polynomial plant model and Kalman filtering methodology to model the degradation trends as described in relation to block 802 of FIG.8.

In block 904, the state estimate matrix equation, which is similar to Equation (17) from block 802 of FIG. 8, may be corrected based on observed degradation in the time interval. Equation 17 will provide the expected degradation in a future time interval $\Delta t$. At the end of the time interval $\Delta t$, based on the rate of change of the health signature the observed degradation in calculated. Based on the observed degradation, degradation state $x_t$ in Equation 16 is corrected. For example, as described above, the RUL estimation process in blocks 300, 302, 600-604, 310-314, 606, 900-906 are repeated periodically. During each iteration of RUL estimation for a switching device, the state estimation matrix equation, which is similar to Equation (17) from block 802 of FIG. 8, is adjusted based on the actual rate of degradation measured at the particular time interval to ensure that the state estimation matrix equation is as accurate as possible. Thus, each iteration of estimating the RUL would make the state estimation matrix equation more accurate.

In block 906, the corrected state estimation matrix equation from block 904 can be used to forecast a time at which the switching devices S1-S6 reach a failure criterion. For example, a failure criterion may be defined as degradation state at which the switching devices S1-S6 are operationally deficient. In some examples, operationally deficient may be defined as degradation state at which a switching device from the switching devices S1-S6 has a health index value that has dropped down to a predetermined threshold value. For example, a predetermined threshold value may be 80% of the initial health index value. The initial health index value of a switching device may include the health index value that was calculated for the switching device when the switching device was first measured. In such a case, the corrected state estimation matrix equation from block 804 may be used to determine the time at which a switching device reaches a failure criterion, which may be defined as when the health index of the switching device reaches 80% of the initial health index value.

The estimated RUL, including the forecasted time at which each of the switching devices S1-S6 is estimated to reach a failure criterion, may be used to create a notification system as further described in FIG. 7.

The present invention provides a variety of advantages. For example, the present invention enables real time monitoring of switching devices using the health signatures of $R_{DSON}$, $V_{CEON}$, which in turn can produce more accurate life estimation of the switching devices. Generally, the RUL estimations can reduce operational interruptions that are caused by the failures of the switching devices. Early detection of these failures produces alerts (e.g., notifications) and/or alarms that lead to the repair or the replacement of the switching devices prior to their failure, thereby avoiding interruptions in service.

In some instances, additional sensors (e.g., voltage, current, temperature) are not needed in various motor control systems apart from the sensors that used for motor control. Due to a lower sampling rate, the present invention can be implemented easily on any embedded board with lower memory. The present invention is independent of the type of the switching devices used in the switching system 110 (e.g., pMOS or nMOS) and/or the manufacturer of the switching devices, the control system, and the like. Additionally or alternatively, the estimations can be normalized and made independent of the load (speed, torque etc.) and the operating point of the system.

The examples described herein relate to aircraft and AFTM systems. However, other examples are not limited to this implementation. Other example applications include uninterruptible power supply (UPS) applications, high-voltage direct current (HVDC) fuel pumps, industrial drives, and electric aircraft or electric vehicle inverters or converters. Additionally, the present invention can be applied to individual devices, as well as at the chip or the module level for devices with in-chip or module packages.

Various modifications and alterations of this disclosure will become apparent to those skilled in the art without departing from the scope and spirit of this disclosure, and it should be understood that the inventive scope of this disclosure is not to be unduly limited to the illustrative examples set forth herein.

Aspects of the Disclosure:

Aspect 1: A method of estimating a remaining useful life (RUL) of a switching device, comprising:
  estimating an on-state resistance for the switching device while the switching device is in use, the estimation including a phase voltage and a phase current associated with the switching device;
  estimating a power dissipation for the switching device, wherein the power dissipation is based on the on-state resistance of the switching device;
  estimating a junction temperature of the switching device, wherein the estimation of the junction temperature is based on the power dissipation;
  estimating a failure rate for the switching device, wherein the failure rate is based on the junction temperature; estimating a mean time between failures (MTBF) for the switching device, wherein the MTBF is related to the failure rate of the switching device and the MTBF represents the RUL of the switching device; and
  causing a notification to be provided to an output device, the notification including at least the RUL of the switching device.

Aspect 2: The method of the aspect 1, wherein the switching device is a metal-oxide-semiconductor field-effect transistor.

Aspect 3. The method of aspect 2, wherein estimating the on-state resistance for the switching device comprises:
  estimating the on-state resistance at a positive peak of a positive half-cycle of the phase current; or
  estimating the on-state resistance at a negative peak of a negative half-cycle of the phase current.

Aspect 4. The method of claim aspect 3, wherein estimating the on-state resistance at the positive peak of the positive half-cycle of the phase current comprises estimating the on-state resistance using an equation $$R_{DSON,Sn} = \frac{v_{DS,Sn}}{i_{DS,Sn}} = \frac{v_{dc} - v_x}{i_x},$$

where $R_{DSON}$ represents the on-state resistance, vac represents a direct current (DC)-link capacitor voltage, $s_n$ represents the switching device, $v_x$ represents the phase voltage associated with the switching device, and $i_x$ represents the phase current associated with the switching device.

Aspect 5. The method of aspect 4, wherein estimating the on-state resistance at the negative peak of the negative half-cycle of the phase current comprises estimating the on-state resistance using an equation $$R_{DSON,Sn} = \frac{v_{DS,Sn}}{i_{DS,Sn}} = \frac{v_x}{-i_x},$$

where $R_{DSON}$ represents the on-state resistance, $s_n$ represents the switching device, $v_x$ represents the phase voltage associated with the switching device, and $i_x$ represents the phase current associated with the switching device.

Aspect 6. The method of aspect 2, wherein:
  estimating the power dissipation for the switching device comprises estimating the power dissipation for the switching device using an equation $P=I^2R_{DSON}$, where P represents the power dissipation and $R_{DSON}$ represents the on-state resistance.
  estimating the junction temperature of the switching device comprises estimating the junction temperature of the switching device using an equation $T_j=T_c+\theta jcP$, where $T_j$ represents the junction temperature, $T_C$ represents a case temperature $\theta_{jc}$ represents a junction to case thermal resistance, and P represents the power dissipation.

Aspect 7. The method of aspect 2, wherein estimating the failure rate for the switching device comprises estimating the failure rate for the switching device using the equations $\lambda_P=\lambda_b\pi_T\pi_Q\pi_A\pi_E$ and $\pi_T=f$ $(T_j, R_{DSON})$, where $\lambda_b$ represents a base failure rate, $\pi_T$ represents a temperature factor, $\pi_Q$ represents a quality factor, $\pi_A$ represents an application factor, $\pi_E$ represents an environmental factor, $\pi_T$ represents a temperature factor as a function of the junction temperature, $T_j$ represents the junction temperature, and $R_{DSON}$ represents the on-state resistance.

Aspect 8. The method of aspect 7, wherein estimating the MTBF for the switching device comprises estimating the MTBF for the switching device using the equation $$MTBF = \frac{1}{\lambda_P}.$$

Aspect 9. A method of estimating a remaining useful life (RUL) of a switching device, the method comprising:
  estimating an on-state voltage for the switching device while the switching device is in use, the estimation including a phase voltage and a phase current associated with the switching device;
  estimating a power dissipation for the switching device, wherein the power dissipation is based on the on-state voltage of the switching device;
  estimating a junction temperature of the switching device, wherein the estimation of the junction temperature is based on the power dissipation;
  estimating a failure rate for the switching device, wherein the failure rate is based on the junction temperature;
  estimating a mean time between failures (MTBF) for the switching device, wherein the MTBF is related to the failure rate of the switching device and the MTBF represents the RUL of the switching device; and
  causing a notification to be displayed at a display device, the notification including at least the RUL of the switching device.

Aspect 10. The method of aspect 9, wherein the switching device is an insulated-gate bipolar transistor.

Aspect 11. The method of aspect 10, wherein estimating the on-state voltage for the switching device comprises:
  estimating the on-state voltage at a positive peak of a positive half-cycle of the phase current; or estimating the on-state voltage at a negative peak of a negative half-cycle of the phase current.

Aspect 12. The method of aspect 11, wherein estimating the on-state voltage at the positive peak of the positive half-cycle of the phase current comprises estimating the on-state voltage using an equation $\upsilon_{CEON,Sn}=V_{J,Sn}+(i_xR_{ON,Sn})$, where $\upsilon_{CEON,Sn}$ represents the on-state voltage for the switching device Sn, $V_{J,Sn}$ represents a forward voltage of the switching device, $i_x$ represents the phase current associated with the switching device, and $R_{ON,Sn}$ represents an on-state resistance of the switching device.

Aspect 13. The method of aspect 12, wherein estimating the on-state voltage at the negative peak of the negative half-cycle of the phase current comprises estimating the on-state voltage at the negative peak of the negative half-cycle of the phase current using an equation $\upsilon_{CEON,Sn}=V_{J,Sn}+(-i_xR_{ON,Sn})$.

Aspect 14. The method of aspect 10, wherein:
estimating the power dissipation for the switching device comprises estimating the power dissipation for the switching device using an equation $P=I_cV_{CEON}$, where P represents the power dissipation and $V_{CEON}$ represents the on-state voltage of the switching device; and
estimating the junction temperature of the switching device comprises estimating the junction temperature of the switching device using an equation $T_j=T_a+\theta jaP$, where $T_j$ represents the junction temperature, $T_a$ represents an ambient temperature, $\theta_{ja}$ represents a junction to ambient thermal resistance, and P represents the power dissipation.

Aspect 15. The method of aspect 10, wherein estimating the failure rate for the switching device comprises estimating the failure rate for the switching device using equations $\lambda_O=\lambda_b\pi_T\pi_Q\pi_A\pi_E$ and $\pi_T=f(T_j, V_{CEON})$, where $\lambda_b$ represents a base failure rate, $\pi_T$ represents a temperature factor, $\pi_Q$ represents a quality factor, $\pi_A$ represents an application factor, $\pi_E$ represents an environmental factor, $\pi_T$ represents a temperature factor as a function of a junction temperature, $T_j$ represents the junction temperature, and $V_{CEON}$ represents the on-state voltage of the switching device.

Aspect 16. The method of aspect 15, wherein estimating the MTBF for the switching device comprises estimating the MTBF for the switching device using the equation $$MTBF = \frac{1}{\lambda_P}.$$

Aspect 17. A control system for a three-phase motor, the control system comprising:
a processing device;
a pulse width modulator (PWM) driver circuit operably connected to the processing device, the PWM driver circuit operable to output three-phase current signals;
a switching system operably connected between the PWM driver circuit and a three-phase motor, the switching system including a plurality of switching devices operable to output three-phase voltage signals;
a three-phase current sensor operably connected between the PWM driver circuit and the processing device, the three-phase current sensor operable to receive the three-phase current signals and sense current signals associated with the three-phase current signals;
a voltage sensor operably connected between the switching system and the processing device, the voltage sensor operable to receive the three-phase voltage signals and sense voltage signals associated with the three-phase current signals; and a temperature sensor operably connected to the processing device.

Aspect 18. The control system of aspect 17, wherein:
the voltage sensor is a first voltage sensor; and
the control system further comprises a second voltage sensor operably connected to the processing device and operable to determine a voltage level of a direct current signal that is received from a power supply.

Aspect 19. The control system of aspect 17, further comprising a memory storing instructions, that when executed by the processing device, cause the processing device to estimate a junction temperature for each switching device in the plurality of switching devices.

Aspect 20. The control system of aspect 19, wherein the memory stores further instructions for estimating a remaining useful life of each switching device in the switching system based at least in part on the current signals received from the three-phase current sensor, the voltage signals received from the voltage sensor, a temperature signal received from the temperature sensor, and the junction temperatures.

Aspect 21. A method of estimating a remaining useful life (RUL) of a switching device, the method comprising:
estimating a health signature of the switching device while the switching device is in use;
calculating a health state estimation matrix by modeling the degradation of a health signature over a time interval using Kalman filtering;
using the health state estimation matrix, determining a health state of the switching device at a first time;
forecasting, based on the health state and the health state estimation matrix, a time at which the switching device reaches a failure criterion; and
causing a notification to be provided to an output device, the notification including the time at which the switching device is forecasted to reach the failure criterion.

Aspect 22. The method of aspect 21, further comprising:
estimating a power dissipation for the switching device;
estimating a junction temperature of the switching device; and
based on a relationship between the power dissipation and junction temperature with respect to a pre-defined operating condition at a pre-defined temperature, normalizing the health signature;

Aspect 23. The method of aspect 22, wherein estimating the junction temperature of the switching device comprises estimating the junction temperature of the switching device using an equation $T_j=T_c+\theta jcP$, where $T_j$ represents the junction temperature, $T_c$ represents a case temperature θjc represents a junction to case thermal resistance, and P represents the power dissipation Aspect 24. The method of aspect 21, further comprising:
calculating an observed degradation over a time interval based on a rate of change of the health signature over the time interval; and correcting the health state of the switching device at the first time based on the observed degradation.

Aspect 25. The method of aspect 21, wherein the notification further includes a time for ordering a spare switching device to replace the switching device before the switching device reaches the failure criterion.

Aspect 26. The method of aspect 21, wherein the health state of the switching device at the first time is represented by the equation: $x_t = F_{t-1} x_{t-1}$,
wherein, $x_t$ represents a health state of the switching device at the first time "t", $x_{t-1}$ represents the degradation state of the switching device at a previous time "t−1"; and $F_{t-1}$ represents the health state estimation matrix.

Aspect 27. The method of aspect 21, wherein the switching device is a metal-oxide semiconductor field-effect transistor (MOSFET) device.

Aspect 28. The method of aspect 27, wherein the health signature of the switching device is an on-state resistance for the MOSFET device that is calculated based on a phase voltage and a phase current associated with the MOSFET device.

Aspect 29. The method of aspect 28, wherein estimating the on-state resistance for the MOSFET device comprises:
estimating the on-state resistance at a positive peak of a positive half-cycle of the phase current using an equation:

$$R_{DSON,Sn} = \frac{v_{DS,Sn}}{i_{DS,Sn}} = \frac{v_{dc} - v_x}{i_x},$$

where $R_{DSON}$ represents the on-state resistance, vac represents a direct current (DC)-link capacitor voltage, $s_n$ represents the switching device, $v_x$ represents the phase voltage associated with the switching device, and $i_x$ represents the phase current associated with the switching device.

Aspect 30. The method of aspect 28, wherein estimating the on-state resistance for the MOSFET device comprises:
estimating the on-state resistance at a negative peak of a negative half-cycle of the phase current using an equation:

$$R_{DSON,Sn} = \frac{v_{DS,Sn}}{i_{DS,Sn}} = \frac{v_x}{-i_x},$$

where $R_{DSON}$ represents the on-state resistance, $s_n$ represents the switching device, $v_x$ represents the phase voltage associated with the switching device, and $i_x$ represents the phase current associated with the switching device.

Aspect 31. The method of aspect 21, wherein the switching device is an insulated-gate bipolar transistor (IGBT) device.

Aspect 32. The method of aspect 31, wherein the health signature of the switching device is an on-state voltage for the IGBT device that is calculated based on a phase voltage and a phase current associated with the IGBT device.

Aspect 33. The method of aspect 32, wherein estimating the on-state voltage for the IGBT device comprises:
estimating the on-state voltage at a positive peak of a positive half-cycle of the phase current using an equation: $v_{CEON,Sn} = V_{J,Sn} + (i_x R_{ON,Sn})$,
where $v_{CEON,Sn}$ represents the on-state voltage for the switching device Sn, $V_{J,Sn}$ represents a forward voltage of the switching device, $i_x$ represents the phase current associated with the switching device, and $R_{ON,Sn}$ represents an on-state resistance of the switching device.

Aspect 34. The method of aspect 32, wherein estimating the on-state voltage for the IGBT device comprises:
estimating the on-state voltage at a negative peak of a negative half-cycle of the phase current using an equation: $v_{CEON,Sn} = V_{J,Sn} + (-i_x R_{ON,Sn})$,
where $v_{CEON,Sn}$ represents the on-state voltage for the switching device Sn, $V_{J,Sn}$ represents a forward voltage of the switching device, $i_x$ represents the phase current associated with the switching device, and $R_{ON,Sn}$ represents an on-state resistance of the switching device.

Aspect 35. The method of claim 21, wherein the switching device is part of a control system for a three-phase motor.

Aspect 36. A control system for a three-phase motor, the control system comprising:
a switching system including a plurality of switching devices operable to output three-phase voltage signals;
a processing device; and
memory storing instructions that when executed by the processing device, cause the processing device to estimate a remaining useful life (RUL) of each of the plurality of switching device, wherein to estimate the RUL of each of the plurality of switching devices includes, for each switching device of the plurality of switching devices:
estimate a health signature of the switching device while the switching device is in use;
calculate a health state estimation matrix by modeling the degradation of a health signature over a time interval using Kalman filtering;
using the health state estimation matrix, determine a health state of the switching device at a first time;
forecast, based on the health state and the health state estimation matrix, a time at which the switching device reaches a failure criterion; and
causing a notification to be provided to an output device, the notification including the time at which the switching device is forecasted to reach the failure criterion.

Aspect 37. The control system of aspect 36, further comprising:
a pulse width modulator (PWM) driver circuit operably connected to the processing device, the PWM driver circuit operable to output three-phase current signals;
the switching system operably connected between the PWM driver circuit and a three-phase motor;
a three-phase current sensor operably connected between the PWM driver circuit and the processing device, the three-phase current sensor operable to receive the three-phase current signals and sense current signals associated with the three-phase current signals;
a voltage sensor operably connected between the switching system and the processing device, the voltage sensor operable to receive the three-phase voltage signals and sense voltage signals associated with the three-phase current signals; and a temperature sensor operably connected to the processing device.

Aspect 38. The control system of aspect 36, wherein:
the voltage sensor is a first voltage sensor; and
the control system further comprises a second voltage sensor operably connected to the processing device and operable to determine a voltage level of a direct current signal that is received from a power supply.

Aspect 39. The control system of aspect 36, wherein the memory storing instructions, when executed by the processing device, further cause the processing device to:
estimate a junction temperature for each switching device of the plurality of switching devices.

Aspect 40. The control system of aspect 39, wherein estimating the RUL of each switching device in the switching system is based at least in part on the current signals received from the three-phase current sensor, the voltage signals received from the voltage sensor, a temperature signal received from the temperature sensor, and the junction temperatures.

What is claimed is:

1. A method of estimating a remaining useful life (RUL) of a switching system that includes a plurality of p-type switching devices and a plurality of n-type switching devices, the switching system used in a three-phase control system, the method comprising:
estimating a health signature of the switching system while the switching system is in use to control a three-phase motor, including:
determining the health signature of each of the p-type switching devices during positive peaks of a three-phase current associated with the three-phase control system;
determining the health signature of each of the n-type switching devices during negative peaks of the three-phase current associated with the three-phase control system;
estimating a junction temperature of each of the plurality of p-type switching devices and the plurality of n-type switching devices;
based on a relationship between the power dissipation and the junction temperature with respect to a pre-defined operating condition at a pre-defined temperature, normalizing the health signature to generate a normalized health signature;
calculating a health state estimation matrix by modeling the degradation of the normalized health signature over a time interval using Kalman filtering;
using the health state estimation matrix, determining a health state of the switching system at a first time;
forecasting, based on the health state and the health state estimation matrix, a time at which the each of the plurality of p-type switching devices and each of the plurality of n-type switching devices within the switching system reach a failure criterion; and
causing a notification to be provided to an output device, the notification including the time at which the each of the plurality of p-type switching devices and each of the plurality of n-type switching devices is forecasted to reach the failure criterion.

2. The method of claim 1, wherein estimating the junction temperature of each of the plurality of p-type switching devices and the plurality of n-type switching devices comprises estimating the junction temperature of the each of the plurality of p-type switching devices and the plurality of n-type switching devices using an equation $T_j = T_c + \theta jcP$, where $T_j$ represents the junction temperature, $T_c$ represents a case temperature θjc represents a junction to case thermal resistance, and P represents the power dissipation.

3. The method of claim 1, further comprising:
calculating an observed degradation over a time interval based on a rate of change of the health signature over the time interval; and
correcting the health state of the switching system at the first time based on the observed degradation.

4. The method of claim 1, wherein the notification further includes a time for ordering a spare switching device to replace a switching device of the plurality of p-type switching devices or the plurality of n-type switching devices before the switching device reaches the failure criterion.

5. The method of claim 1, wherein the health state of the switching device system at the first time is represented by the equation: $x_t = F_{t-1} x_{t-1}$ for each of switching device of the plurality of p-type switching devices and the plurality of n-type switching devices included within the switching system,
wherein, $x_t$ represents a health state of the switching device at the first time "t", $x_{t-1}$ represents the degradation state of the switching device at a previous time "t−1"; and $F_{t-1}$ represents the health state estimation matrix.

6. The method of claim 1, wherein the switching system is composed of metal-oxide semiconductor field-effect transistor (MOSFET) switching devices.

7. The method of claim 6, wherein the health signature of the switching system is an on-state resistance for each of the MOSFET switching devices within the switching system, wherein the on-state resistance for a MOSFET switching device of the MOSFET switching devices is calculated based on a phase voltage and a phase current associated with the MOSFET switching device.

8. The method of claim 7, wherein estimating the on-state resistance for the MOSFET switching device comprises:
estimating the on-state resistance at a positive peak of a positive half-cycle of the phase current using an equation:

$$R_{DSON,Sn} = \frac{v_{DS,Sn}}{i_{DS,Sn}} = \frac{v_{dc} - v_x}{i_x},$$

where $R_{DSON}$ represents the on-state resistance, $v_{dc}$ represents a direct current (DC)-link capacitor voltage, $s_n$ represents the MOSFET switching device, $v_x$ represents the phase voltage associated with the MOSFET switching device, and $i_x$ represents the phase current associated with the MOSFET switching device.

9. The method of claim 7, wherein estimating the on-state resistance for the MOSFET switching device comprises:
estimating the on-state resistance at a negative peak of a negative half-cycle of the phase current using an equation:

$$R_{DSON,Sn} = \frac{v_{DS,Sn}}{i_{DS,Sn}} = \frac{v_{dc} - v_x}{i_x},$$

where $R_{DSON}$ represents the on-state resistance, $s_n$ represents the MOSFET switching device, $v_x$ represents the phase voltage associated with the MOSFET switching device, and $i_x$ represents the phase current associated with the MOSFET switching device.

10. The method of claim 1, wherein the switching system is composed of insulated-gate bipolar transistor (IGBT) switching device.

11. The method of claim 10, wherein the health signature of the switching system is an on-state voltage for each of the IGBT switching devices within the switching system, wherein the on-state voltage for a IGBT switching device of the IGBT switching devices is calculated based on a phase voltage and a phase current associated with the IGBT switching device.

12. The method of claim 11, wherein estimating the on-state voltage for the IGBT switching device comprises:
estimating the on-state voltage at a positive peak of a positive half-cycle of the phase current using an equation: VCEON,Sn =VJ,sn + (ixRON,sn), where VCEON, Sn represents the on-state voltage for the IGBT switching device Sn, VJ,sn represents a forward voltage of the IGBT switching device, ix represents the phase current associated with the IGBT switching device, and RON,Sn represents an on-state resistance of the IGBT switching device.

13. The method of claim 11, wherein estimating the on-state voltage for the IGBT switching device comprises:
estimating the on-state voltage at a negative peak of a negative half-cycle of the phase current using an equation: $v_{CEON,Sn}=V_{J,Sn}+(-i_x R_{ON,Sn})$,
where $V_{CEON,Sn}$ represents the on-state voltage for the IGBT switching device Sn, $V_{J,sn}$ represents a forward voltage of the IGBT switching device, $i_x$ represents the phase current associated with the IGBT switching device, and $R_{ON,Sn}$ represents an on-state resistance of the IGBT switching device.

14. A three-phase control system for a three-phase motor, the three-phase control system comprising:
a switching system including a plurality of switching devices, including a plurality of p-type switching devices and a plurality of n-type switching devices, operable to output three-phase voltage signals to control the three-phase motor;
a processing device; and
memory storing instructions that when executed by the processing device, cause the processing device to estimate a remaining useful life (RUL) of each of the plurality of switching devices, wherein to estimate the RUL of each of the plurality of switching devices includes to:
determine the health signature of each of the p-type switching devices during positive peaks of a three-phase current associated with the three-phase control system;
determine the health signature of each of the n-type switching devices during negative peaks of the three-phase current associated with the three-phase control system;
estimate a junction temperature of each of the plurality of p-type switching devices and the plurality of n-type switching devices;
based on a relationship between the power dissipation and the junction temperature with respect to a pre-defined operating condition at a pre-defined temperature, normalize the health signature to generate a normalized health signature;
calculate a health state estimation matrix by modeling the degradation of the health signature over a time interval using Kalman filtering;
using the health state estimation matrix, determine a health state of the switching at a first time;
forecast, based on the health state and the health state estimation matrix, a time at which each of the p-type switching devices and each of the plurality of n-type switching devices reach a failure criterion; and
causing a notification to be provided to an output device, the notification including the time at which each of the plurality of p-type switching devices and each of the plurality of n-type switching devices is forecasted to reach the failure criterion.

15. The control system of claim 14, further comprising:
a pulse width modulator (PWM) driver circuit operably connected to the processing device, the PWM driver circuit operable to output three-phase current signals;
the switching system operably connected between the PWM driver circuit and the three-phase motor;
a three-phase current sensor operably connected between the PWM driver circuit and the processing device, the three-phase current sensor operable to receive the three-phase current signals and sense current signals associated with the three-phase current signals;
a voltage sensor operably connected between the switching system and the processing device, the voltage sensor operable to receive the three-phase voltage signals and sense voltage signals associated with the three-phase current signals; and
a temperature sensor operably connected to the processing device.

16. The control system of claim 15, wherein:
the voltage sensor is a first voltage sensor; and
the control system further comprises a second voltage sensor operably connected to the processing device and operable to determine a voltage level of a direct current signal that is received from a power supply.

17. The control system of claim 14, wherein estimating the RUL of each switching device in the switching system is based at least in part on the current signals received from the three-phase current sensor, the voltage signals received from the voltage sensor, a temperature signal received from the temperature sensor, and the junction temperatures.

18. A method of estimating a remaining useful life (RUL) of a switching device, the method comprising:
estimating a health signature of the switching device while the switching device is in use;
calculating a health state estimation matrix by modeling the degradation of a health signature over a time interval using Kalman filtering;
using the health state estimation matrix, determining a health state of the switching device at a first time;
forecasting, based on the health state and the health state estimation matrix, a time at which the switching device reach a failure criterion; and
causing a notification to be provided to an output device, the notification including the time at which the switching device is forecasted to reach the failure criterion;
wherein the switching device is a metal-oxide semiconductor field-effect transistor (MOSFET) device;
wherein the health signature of the switching device is an on-state resistance for the MOSFET device that is calculated based on a phase voltage and a phase current associated with the MOSFET device; and
wherein estimating the on-state resistance for the MOSFET device comprises:

estimating the on-state resistance at a positive peak of a positive half-cycle of the phase current using an equation:

$$R_{DSON,Sn} = \frac{v_{DS,Sn}}{i_{DS,Sn}} = \frac{v_x}{-i_x},$$

where $R_{DSON}$ represents the on-state resistance, $v_{dc}$ represents a direct current (DC)-link capacitor voltage, Sn represents the switching device, $v_x$ represents the phase voltage associated with the switching device, and $i_x$ represents the phase current associated with the switching device.

19. A method of estimating a remaining useful life (RUL) of a switching device, the method comprising:
estimating a health signature of the switching device while the switching device is in use;
calculating a health state estimation matrix by modeling the degradation of a health signature over a time interval using Kalman filtering;
using the health state estimation matrix, determining a health state of the switching device at a first time;
forecasting, based on the health state and the health state estimation matrix, a time at which the switching device reach a failure criterion; and
causing a notification to be provided to an output device, the notification including the time at which the switching device is forecasted to reach the failure criterion;
wherein the switching device is a metal-oxide semiconductor field-effect transistor (MOSFET) device;
wherein the health signature of the switching device is an on-state resistance for the MOSFET device that is calculated based on a phase voltage and a phase current associated with the MOSFET device;
wherein estimating the on-state resistance for the MOSFET device comprises:
estimating the on-state resistance at a negative peak of a negative half-cycle of the phase current using an equation:

$$R_{DSON,Sn} = \frac{v_{DS,Sn}}{i_{DS,Sn}} = \frac{v_x}{-i_x},$$

where $R_{DSON}$ represents the on-state resistance, $s_n$ represents the switching device, $v_x$ represents the phase voltage associated with the switching device, and $i_x$ represents the phase current associated with the switching device.

20. A method of estimating a remaining useful life (RUL) of a switching device, the method comprising:
estimating a health signature of the switching device while the switching device is in use;
calculating a health state estimation matrix by modeling the degradation of a health signature over a time interval using Kalman filtering;
using the health state estimation matrix, determining a health state of the switching device at a first time;
forecasting, based on the health state and the health state estimation matrix, a time at which the switching device reach a failure criterion; and
causing a notification to be provided to an output device, the notification including the time at which the switching device is forecasted to reach the failure criterion;
wherein the switching device is an insulated-gate bipolar transistor (IGBT) device;
wherein the health signature of the switching device is an on-state voltage for the IGBT device that is calculated based on a phase voltage and a phase current associated with the IGBT device;
wherein estimating the on-state voltage for the IGBT device comprises:
estimating the on-state voltage at a positive peak of a positive half-cycle of the phase current using an equation: $v_{CEON,Sn} = V_{J,Sn} + (-i_x R_{ON,Sn})$,
where $V_{CEON,Sn}$ represents the on-state voltage for the switching device Sn, $V_{J,Sn}$ represents a forward voltage of the switching device, $i_x$ represents the phase current associated with the switching device, and $R_{ON,Sn}$ represents an on-state resistance of the switching device.

21. A method of estimating a remaining useful life (RUL) of a switching device, the method comprising:
estimating a health signature of the switching device while the switching device is in use;
calculating a health state estimation matrix by modeling the degradation of a health signature over a time interval using Kalman filtering;
using the health state estimation matrix, determining a health state of the switching device at a first time;
forecasting, based on the health state and the health state estimation matrix, a time at which the switching device reach a failure criterion; and
causing a notification to be provided to an output device, the notification including the time at which the switching device is forecasted to reach the failure criterion;
wherein the switching device is an insulated-gate bipolar transistor (IGBT) device;
wherein the health signature of the switching device is an on-state voltage for the IGBT device that is calculated based on a phase voltage and a phase current associated with the IGBT device;
wherein estimating the on-state voltage for the IGBT switching device comprises:
estimating the on-state voltage at a negative peak of a negative half-cycle of the phase current using an equation: $v_{CEON,Sn} = V_{J,Sn} + (-i_x R_{ON,Sn})$,
where $V_{CEON,Sn}$ represents the on-state voltage for the switching device Sn, $V_{J,Sn}$ represents a forward voltage of the switching device, $i_x$ represents the phase current associated with the switching device, and $R_{ON,Sn}$ represents an on-state resistance of the switching device.

\* \* \* \* \*